US008648588B2

(12) United States Patent
Eken et al.

(10) Patent No.: US 8,648,588 B2
(45) Date of Patent: Feb. 11, 2014

(54) RF DETECTOR WITH CREST FACTOR MEASUREMENT

(75) Inventors: Yalcin Alper Eken, Istabul (TR); Peter Katzin, Arlington, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 451 days.

(21) Appl. No.: 13/109,808

(22) Filed: May 17, 2011

(65) Prior Publication Data

US 2012/0013405 A1    Jan. 19, 2012

Related U.S. Application Data

(63) Continuation of application No. 12/645,196, filed on Dec. 22, 2009, now Pat. No. 7,944,196, which is a continuation of application No. 12/152,634, filed on May 14, 2008, now Pat. No. 7,659,707.

(60) Provisional application No. 60/930,120, filed on May 14, 2007.

(51) Int. Cl.
*G01R 19/00*    (2006.01)

(52) U.S. Cl.
USPC .................. 324/76.11; 324/123 R; 702/60

(58) Field of Classification Search
None
See application file for complete search history.

(56) References Cited

U.S. PATENT DOCUMENTS

| | | | |
|---|---|---|---|
| 3,435,353 A | 3/1969 | Sauber | |
| 3,584,232 A | 6/1971 | Wallace, Jr. | |
| 3,605,027 A | 9/1971 | Nichols | |
| 3,668,027 A | 6/1972 | Lansdowne | |
| 3,745,474 A | 7/1973 | Hughes | |
| 4,047,235 A | 9/1977 | Davis | |
| 4,090,150 A | 5/1978 | Vachenauer | |
| 4,156,848 A | 5/1979 | Stimple | |
| 4,604,532 A | 8/1986 | Gilbert | |
| 4,641,259 A | 2/1987 | Shan et al. | |
| 4,748,642 A | 5/1988 | Bertsche | |
| 4,823,382 A | 4/1989 | Martinez | |
| 4,829,824 A | 5/1989 | Hillger et al. | |
| 4,873,484 A | 10/1989 | Adam | |
| 4,929,909 A | 5/1990 | Gilbert | |
| 4,980,584 A | 12/1990 | Goff et al. | |
| 4,990,803 A | 2/1991 | Gilbert | |
| 4,996,500 A | 2/1991 | Larson et al. | |
| 5,029,167 A | 7/1991 | Arnon et al. | |

(Continued)

FOREIGN PATENT DOCUMENTS

EP    0594358 A2    4/1994
WO       9724801 A1    7/1997

*Primary Examiner* — Minh N Tang
(74) *Attorney, Agent, or Firm* — Lando & Anastasi, LLP

(57) ABSTRACT

An RF detector configured to provide two outputs, one being a function of the true RMS power level of an RF input signal, and the other being a function of the instantaneous/peak power of the RF input signal, normalized to the average power level. The RF detector includes a variable gain detection subsystem including a single detector or detector array that provides a representation of the power level of the RF input signal. The detector or detector array is common to both the RMS power detection channel and the instantaneous/peak power detection channel of the RF detector. A method of RF detection includes providing representations of the RF input signal at different gain levels, selecting one or more of the representations, and averaging the selected signals. The gain levels of the selected representations is adjusted to provide information about the average power level of the RF input signal.

14 Claims, 23 Drawing Sheets

(56) References Cited

U.S. PATENT DOCUMENTS

| | | |
|---|---|---|
| 5,043,675 A | 8/1991 | Gilbert |
| 5,049,829 A | 9/1991 | Garskamp et al. |
| 5,070,303 A | 12/1991 | Dent |
| 5,077,541 A | 12/1991 | Gilbert |
| 5,126,586 A | 6/1992 | Gilbert |
| 5,195,827 A | 3/1993 | Audy et al. |
| 5,268,601 A | 12/1993 | Cossins |
| 5,298,811 A | 3/1994 | Gilbert |
| 5,338,985 A | 8/1994 | Fotowat-Ahmady et al. |
| 5,343,522 A | 8/1994 | Yatrou et al. |
| 5,345,185 A | 9/1994 | Gilbert |
| 5,402,451 A | 3/1995 | Kaewell, Jr. et al. |
| 5,414,313 A | 5/1995 | Crescenzi, Jr. et al. |
| 5,432,478 A | 7/1995 | Gilbert |
| 5,453,710 A | 9/1995 | Gilbert et al. |
| 5,473,244 A | 12/1995 | Libove et al. |
| 5,489,868 A | 2/1996 | Gilbert |
| 5,489,878 A | 2/1996 | Gilbert |
| 5,519,308 A | 5/1996 | Gilbert |
| 5,523,875 A | 6/1996 | Morris |
| 5,563,504 A | 10/1996 | Gilbert et al. |
| 5,570,055 A | 10/1996 | Gilbert |
| 5,572,166 A | 11/1996 | Gilbert |
| 5,585,757 A | 12/1996 | Frey |
| 5,589,791 A | 12/1996 | Gilbert |
| 5,594,326 A | 1/1997 | Gilbert |
| 5,608,409 A | 3/1997 | Rilling |
| 5,684,431 A | 11/1997 | Gilbert et al. |
| 5,714,911 A | 2/1998 | Gilbert |
| 5,719,514 A | 2/1998 | Sato et al. |
| 5,729,571 A | 3/1998 | Park et al. |
| 5,732,334 A | 3/1998 | Miyake |
| 5,790,943 A | 8/1998 | Fotowat-Ahmady et al. |
| 5,826,182 A | 10/1998 | Gilbert |
| 5,835,211 A | 11/1998 | Wells et al. |
| 5,847,614 A | 12/1998 | Gilbert et al. |
| 5,989,337 A | 11/1999 | Sato |
| 5,999,062 A | 12/1999 | Gilbert |
| 6,002,291 A | 12/1999 | Gilbert |
| 6,008,701 A | 12/1999 | Gilbert |
| 6,011,431 A | 1/2000 | Gilbert |
| 6,052,349 A | 4/2000 | Okamoto |
| 6,064,277 A | 5/2000 | Gilbert |
| 6,074,082 A | 6/2000 | Gilbert |
| 6,084,472 A | 7/2000 | Gilbert |
| 6,087,883 A | 7/2000 | Gilbert |
| 6,098,463 A | 8/2000 | Goldberg |
| 6,104,244 A | 8/2000 | Gilbert |
| 6,122,497 A | 9/2000 | Gilbert |
| 6,144,244 A | 11/2000 | Gilbert |
| 6,172,549 B1 | 1/2001 | Gilbert |
| 6,204,710 B1 | 3/2001 | Goetting et al. |
| 6,204,719 B1 | 3/2001 | Gilbert |
| 6,245,051 B1 | 6/2001 | Zenker et al. |
| 6,348,829 B1 | 2/2002 | Gilbert |
| 6,429,720 B1 | 8/2002 | Gilbert |
| 6,437,630 B1 | 8/2002 | Gilbert |
| 6,445,248 B1 | 9/2002 | Gilbert |
| 6,456,142 B1 | 9/2002 | Gilbert |
| 6,489,849 B1 | 12/2002 | Gilbert |
| 6,525,601 B2 | 2/2003 | Gilbert |
| 6,549,057 B1 | 4/2003 | Gilbert |
| 6,696,888 B2 | 2/2004 | Gilbert |
| 6,822,433 B1 | 11/2004 | Gilbert |
| 6,861,890 B2 | 3/2005 | Gilbert |
| 6,894,564 B1 | 5/2005 | Gilbert |
| 7,002,394 B1 | 2/2006 | Gilbert |
| 7,088,179 B2 | 8/2006 | Gilbert et al. |
| 7,091,714 B2 | 8/2006 | Gilbert |
| 7,103,029 B1 | 9/2006 | Minowa |
| 7,190,227 B2 | 3/2007 | Gilbert |
| 7,323,933 B2 | 1/2008 | Gilbert |
| 7,327,183 B2 | 2/2008 | Gilbert |
| 7,362,177 B2 | 4/2008 | Gilbert |
| 7,382,190 B2 | 6/2008 | Gilbert |
| 7,652,464 B2 * | 1/2010 | Lang et al. ............ 324/95 |
| 2004/0242170 A1 | 12/2004 | Gilbert |
| 2005/0127986 A1 | 6/2005 | Gilbert |
| 2006/0214653 A1 | 9/2006 | Gilbert |
| 2006/0238254 A1 | 10/2006 | Gilbert et al. |

\* cited by examiner

RF DETECTOR WITH CREST FACTOR MEASUREMENT

CROSS REFERENCE TO RELATED APPLICATIONS

This application is a continuation of, and claims priority under 35 U.S.C. §120 to, U.S. application Ser. No. 12/645,196 entitled "RF DETECTOR WITH CREST FACTOR MEASUREMENT," filed Dec. 22, 2009, now U.S. Pat. No. 7,944,196 which is a continuation of and claims priority under 35 U.S.C. §120 to U.S. application Ser. No. 12/152,634 entitled "RF DETECTOR WITH CREST FACTOR MEASUREMENT," filed May 14, 2008, now U.S. Pat. No. 7,659,707 which claims priority under 35 U.S.C. §119(e) to U.S. Provisional application No. 60/930,120 filed May 14, 2007 and entitled "RF DETECTOR," each of which is herein incorporated by reference in its entirety.

BACKGROUND

1. Field of Invention

The present invention relates generally to RF detectors and, more particularly, to RF detectors capable of providing an indication of both the average power and the instantaneous or peak power levels of an RF signal.

2. Discussion of Related Art

There are many applications in which it is desirable to measure the peak and/or average power level of a radio frequency (RF) signal. For example, power measurement and control of the RF signals in both the transmitting and receiving chains of modern wireless communications systems, such as cellular telephone networks, may be essential. To efficiently use the available bandwidth, the transmitted signals in these systems may be modulated using complex modulation standards such as CDMA, WCDMA or WiMax. These complex modulated signals have a time varying crest factor, which is defined as the peak to average power ratio of the signal, resulting in intolerable errors if conventional power detectors using diode detection or successive amplification are used to measure signal power.

Conventional techniques to characterize modulated signals depend on the parallel processing of the input signal to compute the average power and the instantaneous or peak power. For example, referring to FIG. 1A, a single RF input signal at terminal 102 is processed by an envelope detector or peak detector 104 to generate the instantaneous power/peak power output, a, and is also processed by an average power detector 106 to generate the average power output, b. FIG. 1B illustrates a variation of this method in which the RF input signal is initially processed using a power envelope detector 112 and is then processed using an averaging circuit 114 to generate the average power output, b, and using the buffer/peak detector 104 to generate the instantaneous/peak power output, a.

In some cases, it is desirable to measure the crest factor of the RF signal and/or to obtain information about the signal wave shape. Calculation of the crest factor requires both average power information and peak power information. Referring again to FIG. 1A, a conventional technique uses a divider 108 to calculate the crest factor after parallel processing of the RF input signal to determine the peak power, a, and the average power, b, as discussed, for example, in U.S. Pat. No. 5,220,276. The divider 108 calculates the ratio of the peak detector 104 output (a) to the average power output, b, resulting in an output signal (b/a) on terminal 110 that is a representation of the input signal crest factor. When an envelope detector is used instead of a peak detector, the divider provides an instantaneous power output signal that is normalized to average power; i.e., the ratio of instantaneous power to average power.

A disadvantage of RF detectors using the parallel processing technique is that an RF coupler (not shown) is required at the input 102 to drive both the average power detection channel and the envelope power or peak power detection channel. In addition, because different detectors (104 and 106) are used in the two different detection channels, there may exist part-to-part, process, and temperature variations between the two channels, which can degrade the accuracy of the measurements, particularly of the crest factor measurement. Matching circuitry may be required to compensate for such differences between the two channels, adding complexity and cost to the system. Another disadvantage is that the divider 108 may be required to handle nonlinear calculations depending on the output characteristics of the average power detection channel and the envelope power or peak power detection channel. In addition, because any inaccuracy in the divider would compromise the crest factor measurement, an accurate, possibly complex and expensive, divider may be required.

There are a variety of commercially available average power detectors that may be used in the systems illustrated in FIGS. 1A and 1B. One example of an average power detector is an RMS-DC converter. RMS-DC converters are used to convert the RMS (square-root of the mean (average) of the square) value of an input AC (time-varying) signal into a DC (or quasi-DC) current or voltage. RMS-DC converters are capable of measuring the RMS power of an RF signal independent of the signal wave shape or crest factor. Wide-dynamic range average power detectors using feedback control loop techniques are commercially available.

For example, referring to FIG. 2, there is illustrated a block diagram of an RMS-DC converter 200 that incorporates a squaring RF detector 206 with a variable scale factor and a feedback control loop. The RMS-DC converter receives an RF input, Vin, at terminal 202 and provides a signal at terminal 204 which is representative of the average power of the input signal. The squaring RF detector 206 is responsive to a scaling factor control signal, Vscale, received at a control port 208 and provides an output voltage, Vout, at an output port 209, the output voltage being a representation of the square of the RF input signal scaled by a monotonic function of the control signal. Thus, the output of the squaring RF detector 206 is given by:

$$V_{out}=|V_{in}|^2 \times f(V_{scale}) \qquad (1)$$

The second element of the average power detection feedback loop is an integrator 210 having an input port 212 coupled to the output port 209 of the squaring RF detector 206, a reference port 213 that receives a reference signal 214, and an output port 216 coupled to the control port 208 of the squaring RF detector 206. The output port 216 of the integrator 210 is also coupled to the terminal 204 of the RMS-DC converter 200. The integrator 210 is configured to integrate the difference between the output, Vout, of the squaring RF detector 206 and the reference signal 214 to adjust the scaling factor of the squaring RF detector until the average output signal of the squaring RF detector is equal to the reference signal, thus resulting in a feedback control loop. This feedback loop forces the squaring RF detector 206 to operate at a controlled output operating point. For example, a drop in the RF input signal power received at terminal 202 results in negative integration in the integrator 210, forcing the squaring RF detector 206 to provide amplification to the input signal to keep the average squaring RF detector output, Vout, at a constant point. Because of this interaction in the feedback control loop, the scaling factor control signal, Vscale, of the squaring RF detector 206 will vary as a function of the average of the RF input signal, Vin, providing a representation of this RF input signal average power. Some examples of such, or similar, RMS-DC converters are disclosed in U.S. Pat. Nos. 6,348,829, 6,429,720 and 6,437,630.

Single-detector average power or peak power detecting schemes, such as those illustrated in FIGS. 1A and 1B, suffer from a reduced dynamic range, for example, on the order of about 35 dB in high-frequency integrated circuit detector designs. Average power detector using a feedback control loop technique, such as that illustrated in FIG. 2 and discussed above can achieve much larger dynamic range depending on the scaling function implementation in the feedback control loop. For example, average power detectors with more than 75 dB dynamic range are commercially available. However, in a system such as that illustrated in FIG. 1A, where both peak/envelope and average power are measured, the normalized instantaneous power output or peak power output would be limited by the lesser performance (dynamic range) of the envelope power or peak power detecting scheme. In addition, single-detector envelope power or peak power detecting scheme are generally also highly dependent on the input RF frequency, which may not be desirable in many applications.

SUMMARY OF INVENTION

Aspects and embodiments of the present invention are directed to a wide-dynamic range RF detector that accepts a modulated or unmodulated RF input signal and provides an output which varies as a quasi-linear function of the logarithm of the RMS value of the RF input signal voltage. That is, the RF detector provides an output that varies linearly (or nearly so) with the RMS voltage measured in dB of the RF input signal. The RF detector is also capable of providing a second output representative of the instantaneous or peak power level, of the RF input signal, normalized to the average power of the signal. Embodiments of the RF detector use a single detector array for both average (e.g., RMS) power detection and instantaneous/peak power detection, thereby eliminating some of the part-to-part, process and/or temperature variability issues which may exist with conventional systems, as discussed above. In addition, embodiments of the RF detector implement a feedback control loop to increase the input dynamic range and normalize the measured instantaneous/peak power to the average power, thereby removing the need for an accurate divider. Thus, as discussed further below, the RF detector circuit according to aspects and embodiments of the invention may be used to provide accurate indications of the average power level, normalized instantaneous power level, and peak-to-average power ratio (crest factor) of an RF signal over a wide range of input power levels and modulation complexity.

According to one embodiment, a power detector comprises an input configured to receive an input signal, a variable gain detection subsystem coupled to the input and that detects the input signal and provides a detector output signal, an integrator coupled to the variable gain detection subsystem and configured to receive the detector output signal and a reference signal and to provide an integrator output signal which is representative of an average power level of the input signal, and an instantaneous power processing device coupled to the detector subsystem and configured to receive the detector output signal and to provide at an output of the power detector an instantaneous power output signal which is representative of the instantaneous power level of the input signal normalized to the average power level of the input signal, wherein the variable gain detection subsystem is configured to receive the integrator output signal and to adjust the detector output signal to a level approximately that of the reference signal.

In one example of the power detector, the variable gain detection subsystem comprises at least one squaring detector. The variable gain detection subsystem may further include a variable gain amplifier coupled between the input and the at least one squaring detector, wherein the variable gain amplifier is configured to receive the integrator output signal and to provide an amplified output signal, wherein the variable gain amplifier is configured so that the gain of the variable gain amplifier is controlled by the integrator output signal, and wherein the squaring detector is configured to receive the amplified output signal. In another example, the variable gain detection subsystem includes a gain stage configured to provide a plurality of gain tap signals from the input signal, a plurality of detectors configured to receive the plurality of gain tap signals and to provide a corresponding plurality of detector tap signals, and means for selecting at least one of the plurality of detector tap signals responsive to a control signal and providing the at least one selected detector tap signal as the detector output signal, wherein the control signal is a function of the integrator output signal.

In another example, the variable gain detection subsystem comprises a first series of gain stages coupled in series and configured to provide a first plurality of gain tap signals, a second series of gain stages coupled in series and configured to provide a second plurality of gain tap signals, and a plurality of multipliers coupled to the first and second series of gain stages, wherein each multiplier is configured to multiply a respective one of the first plurality of gain tap signals with a respective one of the second plurality of gain tap signals to provide a plurality of squared signals. In another example, the variable gain detection subsystem includes a gain stage configured to provide a plurality of gain tap signals from the input signal, a plurality of detectors configured to receive a the plurality of gain tap signals and to provide a corresponding plurality of detector tap signals, and an interpolator coupled between the plurality of detectors and the integrator and between plurality of detectors and the instantaneous power processing device, wherein the interpolator is configured to receive the plurality of detector tap signals, to select at least one detector tap signal, and to provide an interpolator output signal that is a function of the at least one selected detector tap signal, and wherein the detector output signal received by the integrator and the instantaneous power processing device comprises the interpolator output signal. The interpolator may be configured to select the detector tap signals from at least those detectors operating in their square-law region. The interpolator output signal may be a function of a weighted sum of the selected detector tap signals. In another example, the gain stage comprises a plurality of amplifiers coupled in series and configured to amplify the input signal to provide a plurality of amplified signals; and wherein the plurality of gain tap signals comprises the plurality of amplified signals. The gain stage may also include a plurality of attenuators configured to attenuate the input signal to provide a plurality of attenuated signals, and the plurality of gain tap signals may comprise the plurality of amplified signals and the plurality of attenuated signals. The interpolator may comprise a plurality of interpolator stages, each interpolator stage configured to receive a respective one of the plurality of detector tap signals, an individual fixed bias reference signal and a common control signal, wherein the common control signal is derived from the integrator output signal. In one example, each interpolator stage comprises a controllable current amplifier, and wherein a gain of the controllable current amplifier is a function of the individual fixed bias reference signal and the common control signal.

In one example of the power detector, the instantaneous power processing device includes a low-pass filter that filters the detector output signal. The low pass filter may have a time constant which is smaller than an output time constant of the integrator. In another example, the instantaneous power processing device includes an amplifier to amplify the detector output signal. In a further example, the instantaneous power processing device comprises a peak detector, and the peak detector output signal is representative of the peak power level of the input signal normalized to the average power level of the input signal. The instantaneous power processing device may also comprise a comparator configured to receive the detector output signal and the reference signal and to generate an error signal based on a subtraction between the detector output signal and the reference signal, and an output block configured to receive the error signal and to provide the instantaneous power output signal. In one example, the output block comprises an output buffer, which may be implemented a transistor follower. In another example, the output block comprises a peak detector that provides a peak detector output signal, wherein the peak detector output signal is representative of the peak power level of the input signal normalized to the average power level of the input signal. The peak detector may be implemented using a transistor follower coupled to a capacitor, wherein the capacitor stores a voltage representative of a peak signal level at an output of the peak detector.

Another example of the power detector comprises an at least partial replica instantaneous power processing device configured to provide a DC reference bias output signal, and a summer configured to receive the DC reference bias signal and the instantaneous power output signal and to subtract the DC reference bias signal from the instantaneous power output signal to generate a DC offset-adjusted instantaneous power output signal, wherein a signal provided at the output of the power detector comprises the adjusted instantaneous power output signal which is representative of the instantaneous power level of the input signal normalized to the average power level of the input signal. In another example, the instantaneous power processing device comprises a peak detector, and the signal provided at the output of the power detector comprises an adjusted peak detector output signal which is representative of the peak power level of the input signal normalized to the average power level of the input signal.

Another aspect is directed to a method of power detection comprising receiving an input signal, detecting a power level of the input signal to provide a detected signal, comparing the detected signal with a reference signal to provide an error signal, integrating the error signal to provide an integrator output signal which is representative of an average power level of the input signal, providing an instantaneous power output signal responsive to the detected signal, the instantaneous power output signal being representative of the instantaneous power level of the input signal normalized to the average power level of the input signal, and adjusting the detected signal to a level approximately that of the reference signal. In one example, detecting the level of the input signal comprises squaring the input signal. The method may further comprise amplifying the input signal with a variable gain amplifier to provide an amplified signal, and adjusting a gain of the variable gain amplifier responsive to the integrator output signal, wherein detecting a level the input signal includes detecting a level of the amplified signal. In one example, providing the instantaneous power output signal includes detecting a peak of the detected signal and providing a peak power output signal normalized to the average power level of the input signal. In another example, providing the instantaneous power output signal includes comparing the detected signal with a second reference signal to provide a second error signal, filtering and buffering the second error signal to provide the instantaneous power output signal.

According to another aspect, a method of power detection comprises providing a plurality of representations of an input signal at different gain levels, detecting the plurality of representations of the input signal to provide a corresponding plurality of detected signals, selecting at least one of the detected signals to provide at least one selected signal, averaging the at least one selected signal to provide an averaged signal, providing an integrator output signal representative of an average power level of the input signal based on the averaged signal, and providing an instantaneous power output signal representative of an instantaneous power level of the input signal normalized to the average power level of the input signal based on the at least one selected signal. In one example, providing a plurality of representations of the input signal further includes attenuating the input signal to provide a plurality of attenuated signals; and wherein the plurality of representations of the input signal further includes the plurality of attenuated signals. In another example, selecting at least one of the detected signals includes interpolating between the plurality of detected signals to provide at least two selected signals, weighting the at least two selected signals to provide at least two weighted signals, and summing the at least two weighted signals to provide an interpolator output signal. In another example, selecting at least one of the detected signals includes selecting those detector signals from detectors operating in their square law region. In one example, detecting the plurality of representations of the input signal includes squaring the plurality of representations of the input signal, and providing the corresponding plurality of detected signals includes providing a corresponding plurality of squared signals. In another example, providing the instantaneous power output signal may include detecting a peak of the detected signal and providing a peak power output signal normalized to the average power level of the input signal.

According to another aspect, a method of power detection comprises generating a series of gain tap signals from an input signal, squaring and weighting each of the gain tap signals, thereby generating a series of weighted output signals, summing the weighted output signals, thereby generating a summed output signal, providing an integrator output signal representative of an average power level of the input signal based on the summed output signal, and providing, responsive to the summed output signal, an instantaneous power output signal representative of an instantaneous power level of the input signal normalized to the average power level of the input signal.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

Figure 1A:
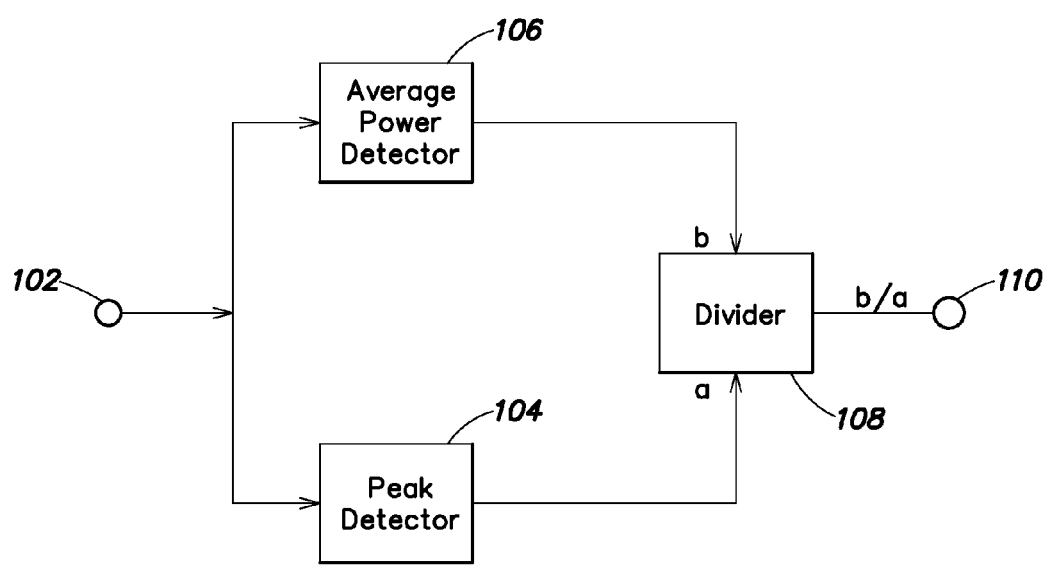
FIG. 1A is a block diagram of one example of a conventional system for measuring the crest factor of an input signal.
Figure 1B:
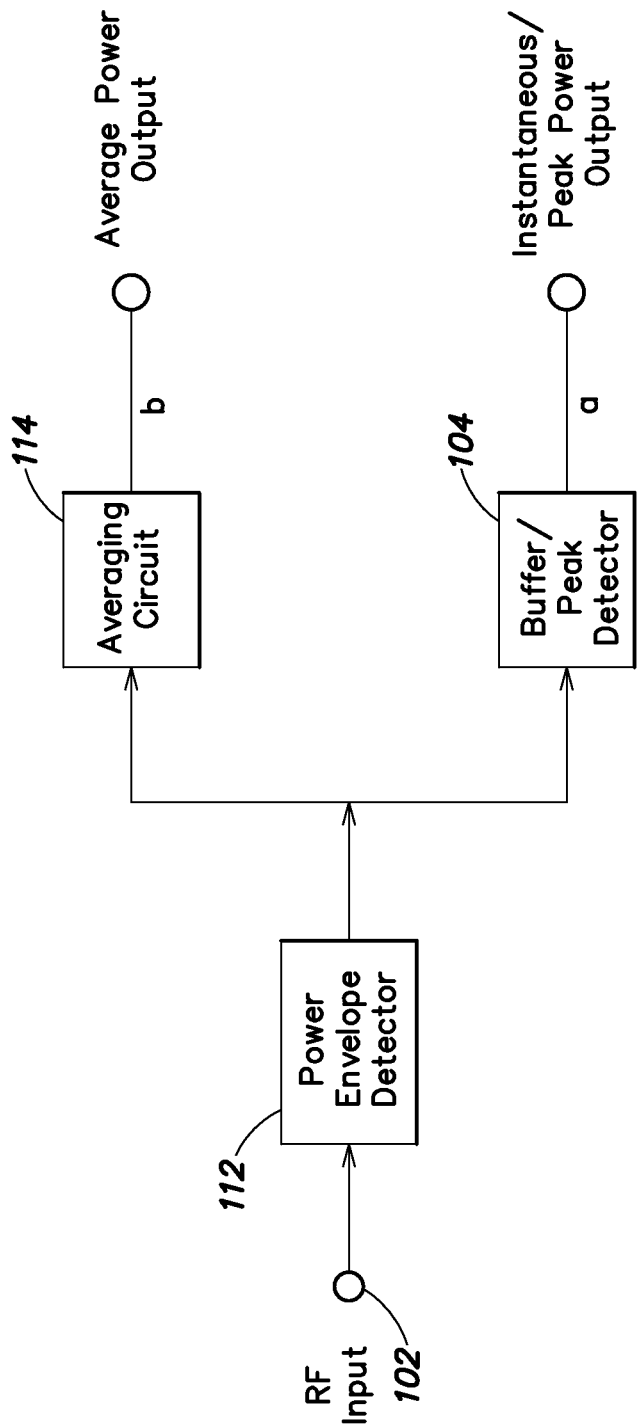
FIG. 1B is a block diagram of another example of a conventional detector system.
Figure 2:
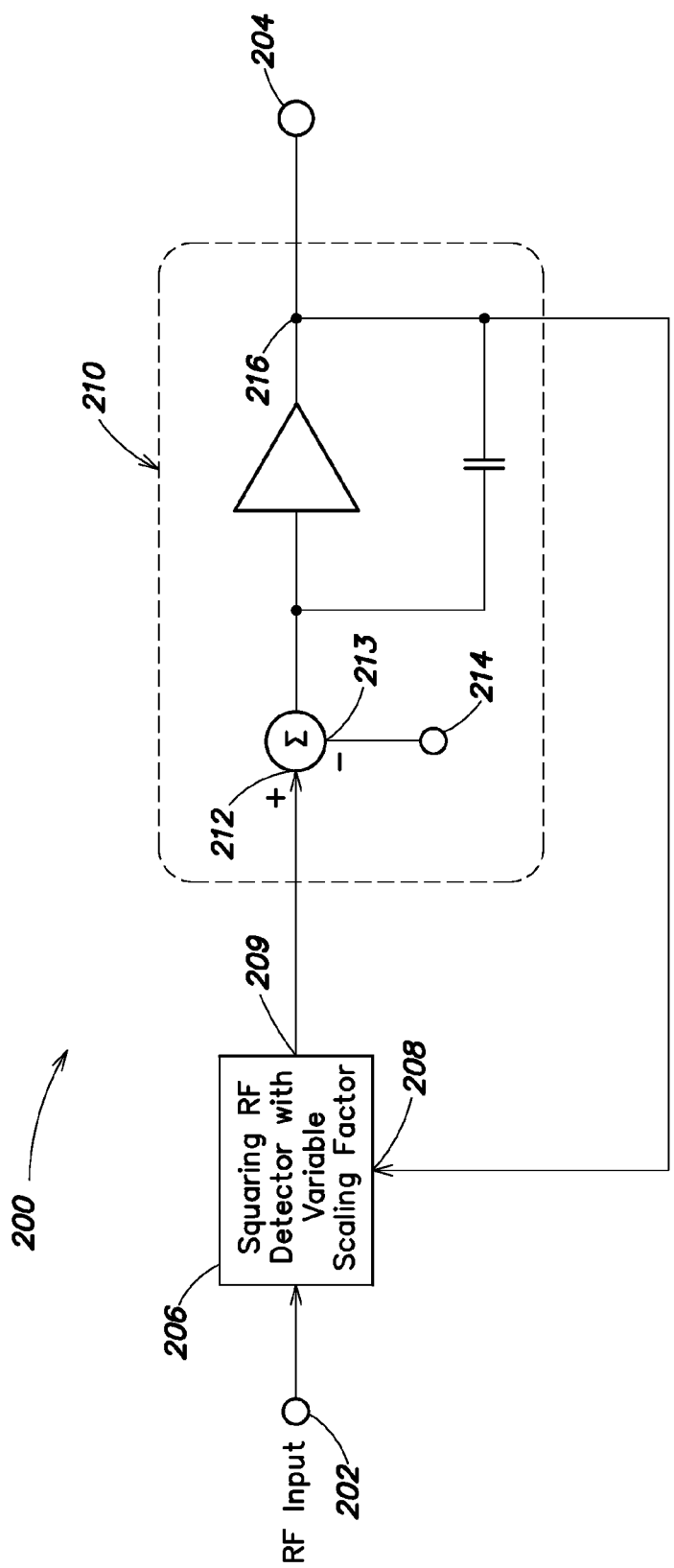
FIG. 2 is a block diagram of one example of a conventional RMS-DC converter.

There is a wide range of applications in which providing an accurate measurement or representation of both the true RMS (root-mean-square) power and an indication of the instantaneous or peak power of an RF signal may be advantageous. For example, in communications systems signal power level measurements may be used to provide a received signal strength indication (RSSI) and/or a transmitter signal strength indication (TSSI). These signal power measurements may also be used for RF power amplifier efficiency control, receiver automatic gain control, and/or transmitter power control. As discussed above, some systems involve complex modulated signals (e.g., CDMA, WCDMA or WiMAX wireless communication systems). These systems may benefit from accurate average power information that is independent of the modulation scheme. In some communication systems, instantaneous or peak power level information, in combination with RMS average power level information may be critical to avoid saturating components in the signal processing chain. Some adaptive power amplifier biasing techniques may also require, or benefit from, crest factor knowledge to accurately set the power amplifier operating conditions for efficient power versus linearity tradeoffs.

Accordingly, aspects and embodiments are directed to a wide-dynamic range RF detector that is capable of providing an indication of the instantaneous or peak power level, normalized to the average power level, of an RF input signal in addition to the true RMS power level. As discussed above, feedback loop control may be used for wide-dynamic range average power detection. The RF detector may provide an accurate indication of the average real power of an RF input signal, independent of the signal shape or crest factor, and thus independent of the modulation scheme applied to the RF input signal. In addition, the RF detector may provide normalized instantaneous power detection that mirrors the input RF modulation envelope, as discussed further below.

It is to be appreciated that embodiments of the methods and apparatuses discussed herein are not limited in application to the details of construction and the arrangement of devices set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Figure 3:
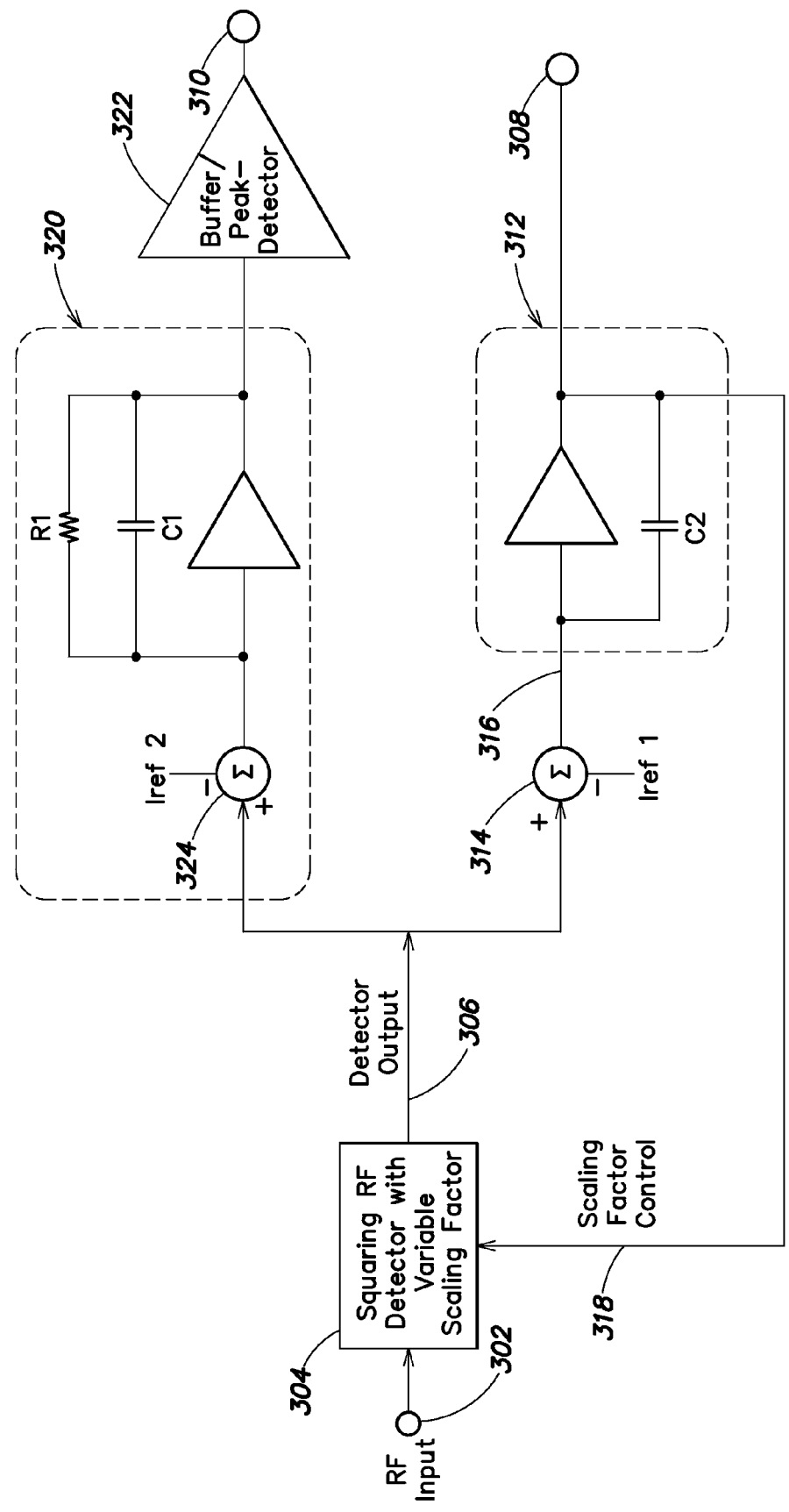
FIG. 3 is a block diagram of an RF detector according to aspects of the invention.
Figure 5:
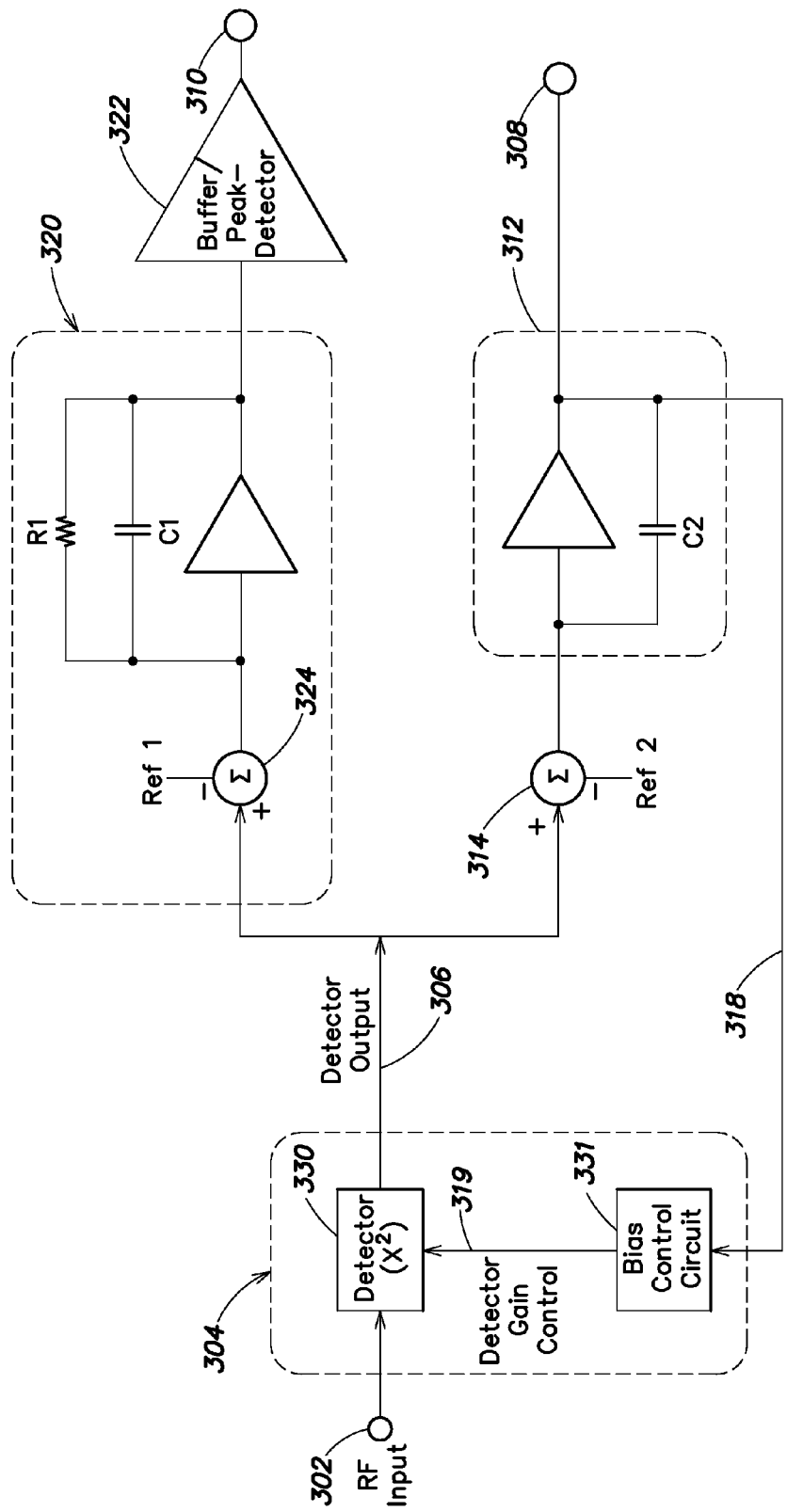
FIG. 5 is a block diagram of one example of an RF detector according to aspects of the invention.
Figure 6:
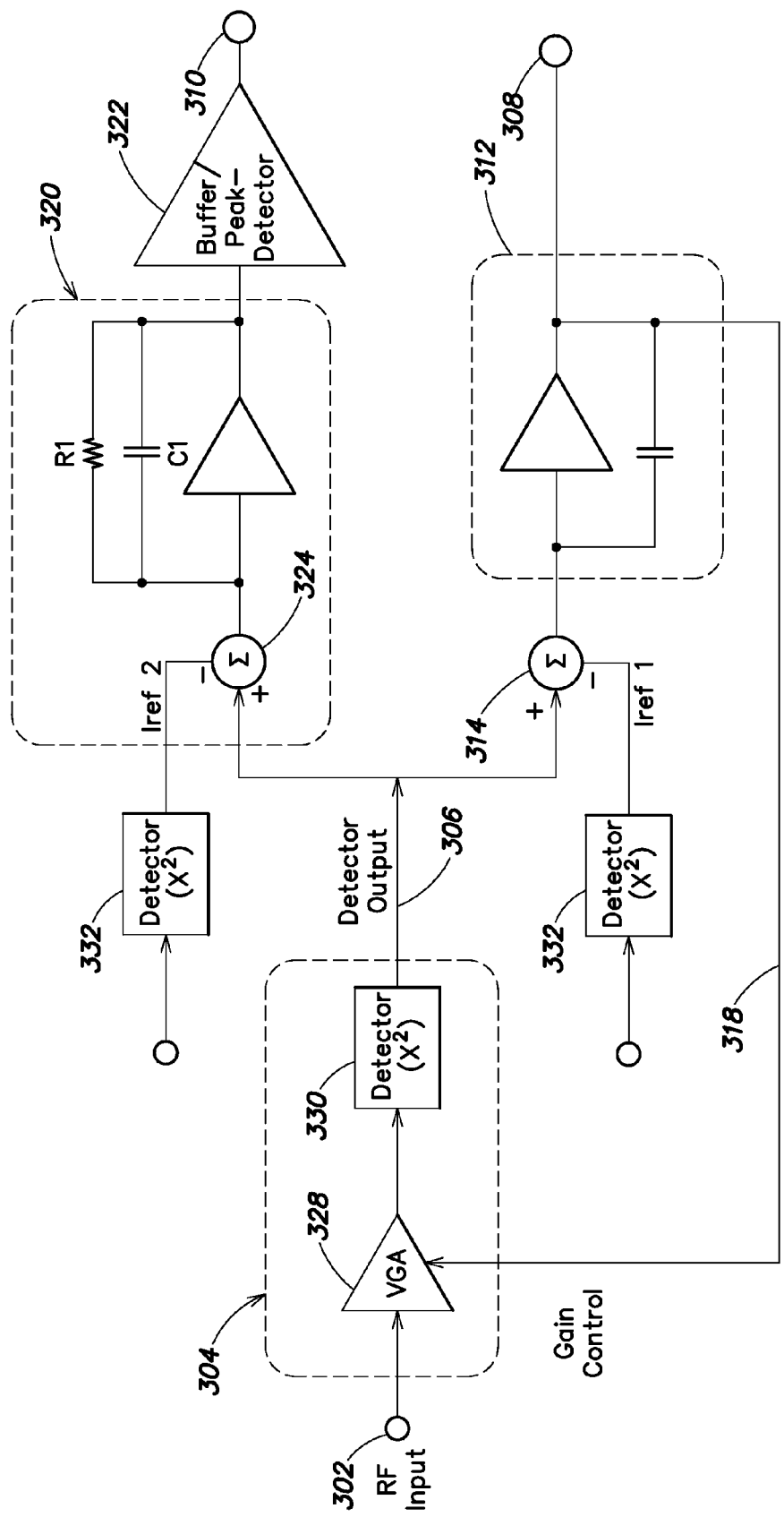
FIG. 6 is a block diagram of another example of an RF detector according to aspects of the invention.

Referring to FIG. 3, there is illustrated a block diagram of one example of an RF detector according to aspects of the invention. The RF detector receives an RF input signal at an RF input terminal 302. This input signal is processed by a variable gain detection subsystem 304 that provides a power detector output signal on line 306. The scaling factor between the level of the detector output signal on line 306 and the RF input power level is controlled by a scaling factor control signal supplied on line 318, as discussed further below. It is to be appreciated that the variable gain detection subsystem 304 may be implemented in a variety of ways, at least some of which are discussed in more detail below. For example, In one embodiment, the variable gain detection subsystem may include a squaring RF detector cell (or array of such cells) along with circuitry to adjust the scaling factor of the detector cell(s), as shown in FIG. 5. In another embodiment, the variable gain detector subsystem 304 may include a variable gain amplifier 328 preceding the squaring RF detector cell(s) 330, as shown in FIG. 6. In another embodiment, the variable gain detection subsystem may provide a plurality of representations of the power level of the RF input signal at different gain levels and these representations may be processed by a detection block and scaled (either during or subsequent to the detection) and summed to provide the detector output signal on line 306, as discussed further below.

According to one embodiment, the detector output signal on line 306 may be provided to an average power detection path which provides an output 308 representative of the true mean-square or root-mean-square (RMS) level of the RF input signal applied at the RF input terminal 302. A slave copy of the detector output signal on line 306 is provided to an instantaneous or peak power detection path which provides an output 310 representative of the instantaneous or peak power level of the RF input signal, as also discussed further below. The output 308 is referred to herein as the RMS output 308, and the signal provided thereat is referred to as the RMS output signal. However, it is to be appreciated that the signal provided at output 308 may be a representation of the mean-square level of the RF input rather than the RMS level. Similarly, the output 310 is referred to herein as the instantaneous power output 310, and the signal provided thereat is referred to as the instantaneous power signal. However, it is to be appreciated that in some examples the signal provided at the output 310 may be representative of the peak (rather than instantaneous) power level of the RF input signal, as discussed further below. The instantaneous power output 310 is normalized to the mean power of the RF signal. In one embodiment, the instantaneous power output 310 follows any amplitude modulation of the RF input signal in such a way that the signal swing on the instantaneous power output varies with the instantaneous power of the modulated RF input signal, as discussed further below.

Still referring to FIG. 3, the average power detection path includes an integrator 312 that averages the detector output signal received on line 306, thus providing at the RMS output 308 a signal that is representative of the average power of the RF input signal applied at the RF input terminal 302. In one embodiment, the average power detection path includes a comparator 314 that compares the signal received from the variable gain detection subsystem 304 (on line 306) to a fixed reference signal, Iref1, provided by a reference generator 346 (see FIG. 8). The comparator may be implemented in a variety of ways, as known to those skilled in the at, including, but not limited to, a subtractor that generates an error signal by subtracting the received detector output signal from the reference signal, or vice versa. The integrator 312 may be responsive to the error signal provided on line 316 from the comparator 314. The integrator may be implemented as an analog circuit, in which case its output will vary in continuous fashion, or as a digital accumulator, in which case its output would vary in discrete steps as a stream of binary data and either or both the RMS output 308 and line 318 on which the scaling control signal is supplied may represent digital busses. It is also to be appreciated that although the comparator 314 is illustrated in FIG. 3 as a separate component from the integrator 312, the comparator 314 may be integrated with the integrator 312 into a single component block and the integrator 312 may be responsive to both the detector output signal (on line 306) and the reference signal, Iref1. The RMS output signal may be provided on line 318 to a control input of the variable gain detection subsystem 304 to adjust the scaling factor of the variable gain detection subsystem, as discussed further below. Thus, the integrator 312 (including the comparator 314) forms a feedback control loop with the variable gain detection subsystem 304 to adjust the scaling factor of the variable gain detection subsystem until the average detector output signal on line 306 is approximately equal to the reference signal, Iref1, as discussed further below. The scaling factor control of the variable gain detection subsystem 304 is a monotonic function of the signal provided on line 318, such as a linear function, a squaring function, or an exponential function. This function may be implemented in continuous (analog) fashion or in discrete steps in which case, as discussed above, line 318 may represent a digital control bus As illustrated in FIG. 3, the instantaneous power detection path includes an instantaneous power processing block 320 and an output block 322. As discussed above, in one embodiment, a slave copy of the detector output signal on line 306 from the variable gain detection subsystem 304 is fed to the instantaneous power processing block 320, the output of which provided, via the output block 322, at the instantaneous power output 310. Because of the feedback control loop discussed above, the average value of the detector output signal on line 306 is equivalent to the reference signal, Iref, resulting in the detector output signal representing the instantaneous power of the input RF signal normalized to average power of the RF input signal. The slave copy of this signal can be buffered, scaled and filtered (in any order) by the instantaneous power processing block 320 and output block 322 to generate the instantaneous power output normalized to average power.

Still referring to FIG. 3, the instantaneous power processing block 320 may be configured to scale and/or filter and/or level-shift the detector output signal. In one example, the instantaneous power processing block is configured to low-pass filter the detector output signal received on line 306. Filtering may be useful to remove RF frequency ripple that may exist at the output of the variable gain detection subsystem 304 on line 306 while preserving the RF input signal modulation envelope. The instantaneous power processing block may be further responsive to a second reference signal, Iref2, provided by the reference generator 346 (see FIG. 8), and may be configured to compare the detector output signal received on line 306 to the reference signal Iref2 using a comparator 324. Operation of the comparator 324 may be considered a level-shifting operation on the detector output signal. The output block 322 is responsive to the output of the instantaneous power processing block 320. In one example, the output block 322 includes an output buffer, wherein the output of the instantaneous power processing block 320 is buffered with the output buffer to generate the output 310 that is representative of the instantaneous power level of the RF input signal normalized to average RF input signal power, as discussed further below. In another example, the output block 322 includes a peak detector that may be used to generate a representation of the peak RF input signal power normalized to average RF input signal power (also defined as the crest factor of the RF input signal), as also discussed further below.

Figure 4:
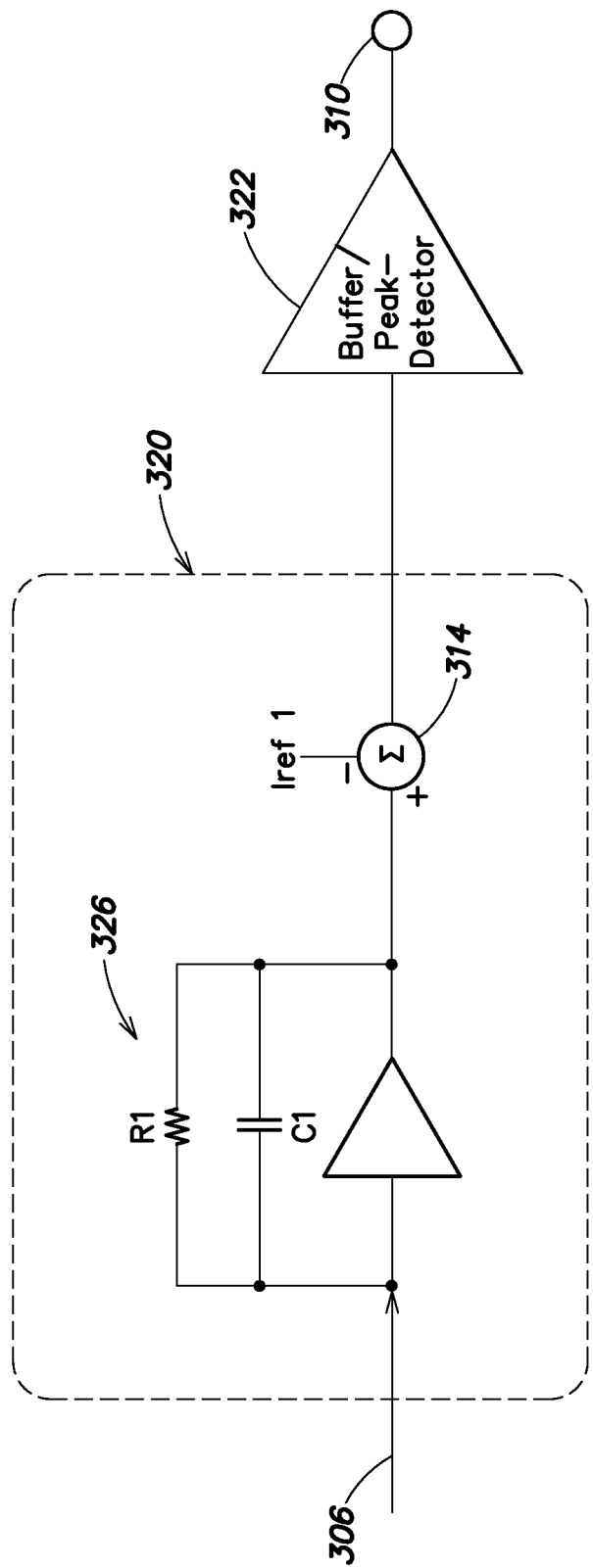
FIG. 4 a block diagram of another example of arrangement of components in the instantaneous/peak power detection channel of an embodiment of the RF detector according to aspects of the invention.

As noted above, buffering, scaling and/or filtering of the detector output signal may be accomplished in any order. For example, as illustrated in FIG. 4, the detector output signal from line 306 may be filtered, and optionally amplified or gain-scaled, by block 326 of the instantaneous power processing block 320, and then compared with the reference signal, Iref2, in comparator 324 before being buffered by output block 322. In addition, it is to be appreciated that the value of the reference signal, Iref2, applied to the comparator 324 may be the same as or different to the value of the reference signal, Iref1, used in the average power detection channel. Furthermore, in some examples, Iref1 may be fed to the instantaneous power processing block 320 (as well as to the first integrator 312) rather than generating a separate second signal, Iref2.

Referring again to FIG. 3, as discussed above, the output block 322 may include a peak detector that may be used to generate the peak power output normalized to the average power, and thus to provide a measurement of the crest factor of the RF input signal. Similar to instantaneous power detection configuration, filtering maybe useful to remove the RF frequency ripple existing at the output of the variable gain detection subsystem 304, while preserving the input modulation envelope and improving crest factor accuracy. As discussed above, conventional systems that provide a crest factor measurement, and thus require both an average power measurement and a peak power measurement, implement parallel processing of the RF input signal and may therefore suffer disadvantages such as part-to-part variations, temperature variations, and different dynamic range capability over the two detection channels, as well as the need for an accurate divider to calculate the crest factor. An RF detector such as that illustrated in FIG. 3 (or variations thereof) may overcome challenges associated with convention RF detectors by dominantly using the components in a wide-dynamic range average power detector having a feedback control loop with minimal additional complexity. The addition of the instantaneous/peak power output 310 may be implemented using only a slave copy of the detector output signal (which is used in the average power detection channel); optionally including some gain/filtering components, and a buffer and/or peak detector, as discussed above. Furthermore, the slave copy of the detector output signal may only operate up to the input signal modulation bandwidth frequency, for example, about 40 MHz, instead of the input RF frequency, which may simplify the components required for the instantaneous power processing block 320 and/or output block 322.

As discussed above, the RF detector may be implemented using various embodiments of the variable gain detection subsystem block 304. For example, referring to FIG. 6, in one embodiment, the RF input signal at input terminal 302 may be fed to a variable gain amplifier 328. The feedback signal on line 318 from the output of the integrator 312 may be used to control the gain of the variable gain amplifier. By sweeping through the gain range of the variable gain amplifier 328 by adjusting the feedback signal on line 318, representations of the RF input signal may be obtained at sequentially varying levels of gain. The output of the variable gain amplifier 328 may drive a squaring detector 330 which provides the detector output signal on line 306. As discussed above, because of the feedback control loop, the average value of the detector output signal on line 306 is driven to approximately match the reference signal, Iref1, and therefore, the system may reach a steady state when the RMS output signal (which is fed back on line 318) selects a gain level of the variable gain amplifier 328 that results in the detector output signal on line 306 being approximately equal to the reference signal, Iref1. It is to be appreciated that of course gain or level-shifting may be provided on line 306 (not shown) such that the detector output signal is driven to a level that is different from the reference signal, Iref1, by a factor of the gain or level-shifting applied on line 306.

As also illustrated in FIG. 6, in another embodiment, the RF detector may include additional squaring detectors 332 which may be used to generate the reference signals, Iref1 and Iref2. In this manner, process and/or temperature variations of the squaring detector 330 may be cancelled in the comparison (or subtraction) operations of the comparators 314 and 324.

In another embodiment, the variable gain detection subsystem 304 includes a squaring detector 330 having a variable squaring gain that is controlled by a bias control circuit 331, as illustrated in FIG. 5. The RF input signal at input terminal 302 is fed to the squaring detector 330 which provides the detector output signal on line 306, as discussed above. The squaring detector 330 may include one or more square law detector cells. In this embodiment, the scale control feedback signal on line 318 drives the bias control circuit 331 which varies the squaring gain of the squaring detector 330 by adjusting the bias current through the square-law detector cell(s) included in the squaring detector 330. The detector output signal on line 306 is used to drive the scale control feedback loop in the same way as discussed above with reference to FIGS. 3 and 6. In one example, the bias control circuit 331 may also adjust the Iref1 and Iref2 bias currents through the additional reference squaring detectors 332 shown in FIG. 6.

Figure 7:
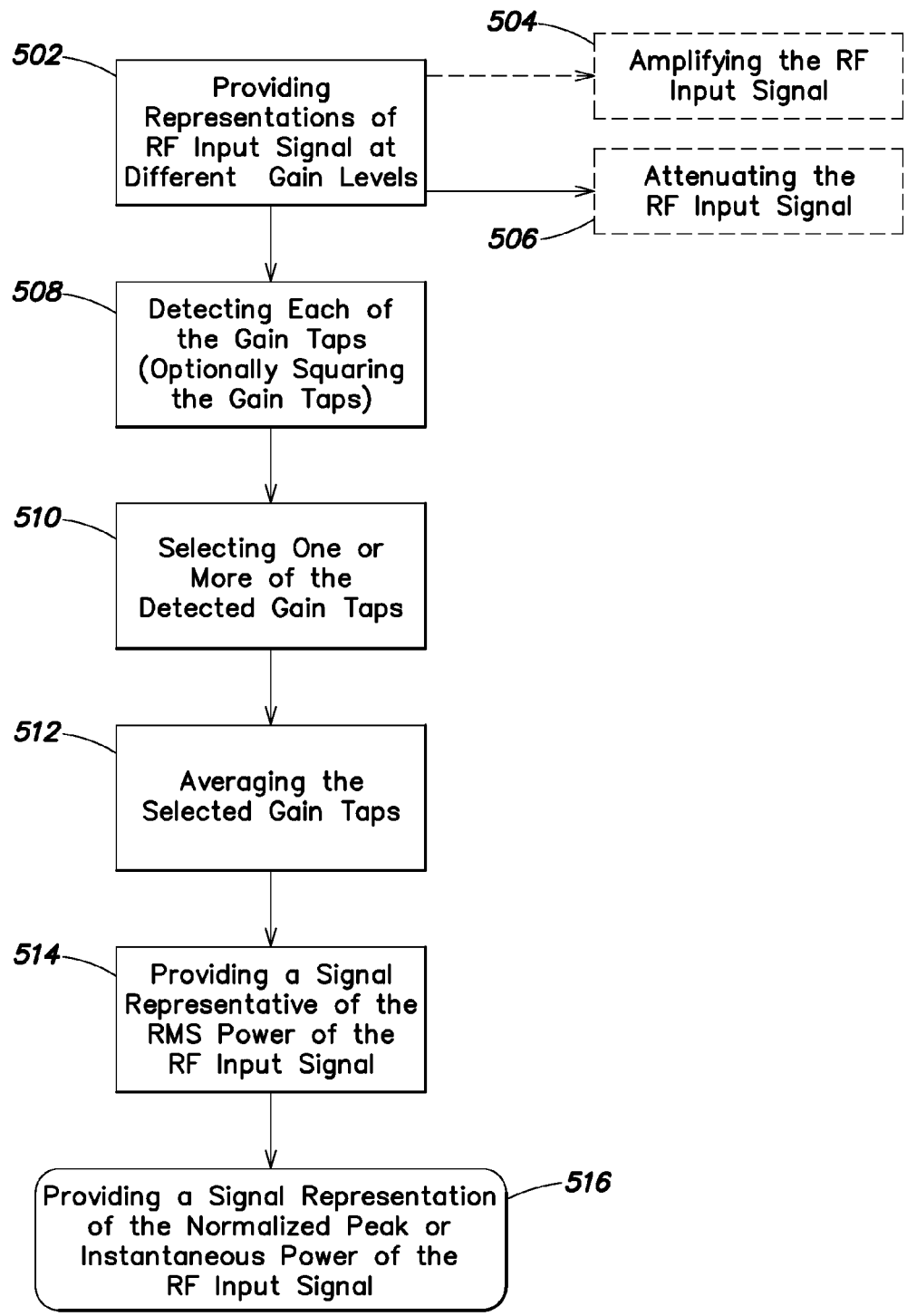
FIG. 7 is a flow diagram illustrating one example of a method of RF detection according to aspects of the invention.

The RF detector may be used to implement various different methods of RF detection. A flow diagram of one example of a method of RF detection is illustrated in FIG. 7. Aspects and embodiments of the method of RF detection are discussed below with continuing reference to FIG. 7.

In one embodiment, a first step 502 includes providing representations of an RF input signal at different gain levels. As discussed above, an RF signal input to the RF detector at the RF input terminal 302 may be processed by the variable gain detection subsystem 304 which may generate multiple representations of the RF input signal at different gain levels.

Figure 8:
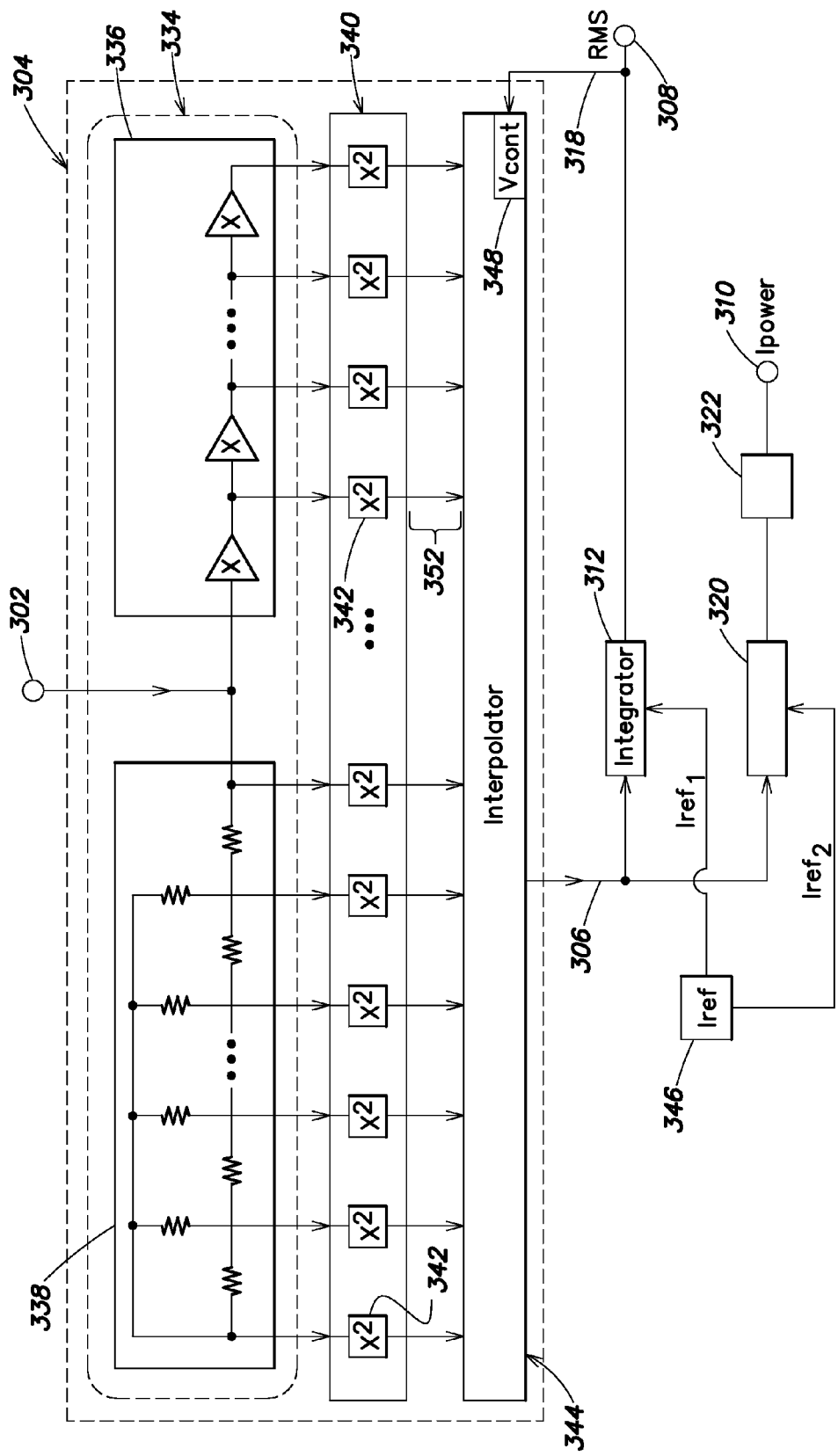
FIG. 8 is a block diagram of another example of an RF detector according to aspects of the invention.

According to one embodiment, the variable gain detection subsystem 304 of the RF detector includes a gain stage 334 which includes a chain of amplifiers 336 which amplify the RF input signal, and a chain of attenuators 338 which attenuate the RF input signal, as illustrated in FIG. 8. It is to be appreciated that the invention is not limited to the inclusion of both amplifiers and attenuators, nor to inclusion of an equal number of amplifiers and attenuators. Rather, embodiments of the RF detector may comprise any number of, and any combination of, amplifiers and/or attenuators. By applying the input RF signal at input terminal 302 to the chains of amplifiers 336 and attenuators 338, a plurality of taps of the input RF signal can be generated that are separated from one another by specific amounts of gain. These taps are referred to herein as "gain taps" of the RF input signal. It is to be appreciated that the term "gain" as used herein refers to both positive gain, for example, as provided by an amplifier, and "negative gain" as provided, for example, by an attenuator. Thus, referring back to FIG. 7, step 502 may include amplifying the RF input signal to provide gain taps at different amplified levels (step 504), and attenuating the RF input signal to provide gain taps at different attenuated levels (step 506).

Referring again to FIG. 8, according to one embodiment, the variable gain detection subsystem 304 also comprises a detector array 340 that includes a plurality of detectors 342. In one example, a detector 342 is provided for each amplifier in the chain of amplifiers 336 and for each attenuator in the chain of attenuators 338 to detect a signal level at the output thereof. The outputs from the detectors 342 may be fed to an interpolator 344 which is configured to select the outputs of those one or more detectors operating in, or closest to, an optimum square law region, as discussed further below. The interpolator 344 provides the detector output current, Iout, on line 306 which is a function of the combined outputs from the selected detectors 342. The position of the selected outputs in the chain of amplifiers 336 and/or chain of attenuators 338 in the gain and detector subsystem 304 may provide information that is representative of the average power level of the RF input, as discussed further below. The interpolator may also include a control input 348 which receives the feedback signal on line 318 from the RMS output 308, as discussed further below.

Figure 9:
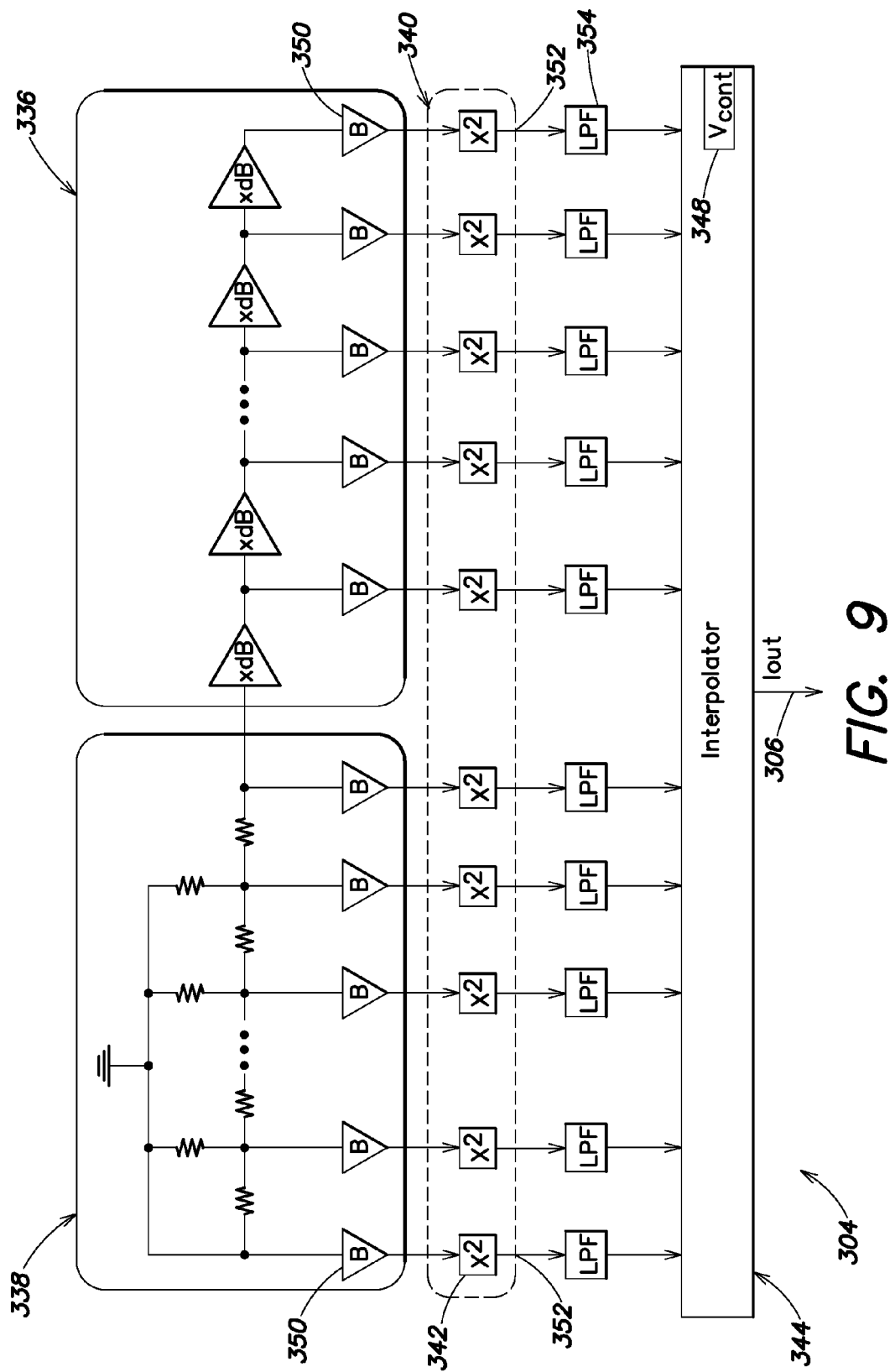
FIG. 9 is a block diagram of one example of a variable gain detection subsystem, according to aspects of the invention.

Referring to FIG. 9, there is illustrated a block diagram of one example of the variable gain detection subsystem 304. As discussed above, the variable gain detection subsystem 304 includes a gain stage 334 which may include a chain of amplifiers 336 and a chain of attenuators 338. In the illustrated example, the chain of attenuators 338 is implemented as a chain of resistors. However, it is to be appreciated that the invention is not so limited and other attenuator elements may be used, as known to those skilled in the art. In one example, each amplifier in the chain of amplifiers 336 may have the same gain, for example, X dB. Similarly, each attenuator in the chain of attenuators 338 may provide the same level of attenuation, for example, also X dB of attenuation (or −X dB of gain). In this example, the RF input signal is fed serially through each amplifier and attenuator, as illustrated in FIG. 9. Assuming that there are N amplifiers in the chain of amplifiers 336, each having a gain of X dB, and M attenuators in the chain of attenuators 338, each having a gain of −X dB, then including a neutral point, there are (M+N+1) gain taps sequentially separated by X dB. Alternatively, the amplifiers and/or attenuators may have different gains and, depending on the gain values and the manner in which the RF input signal to applied to each amplifier and/or attenuator, a number of gain taps may be generated that are sequentially separated by the same or different amounts of gain.

Figure 10:
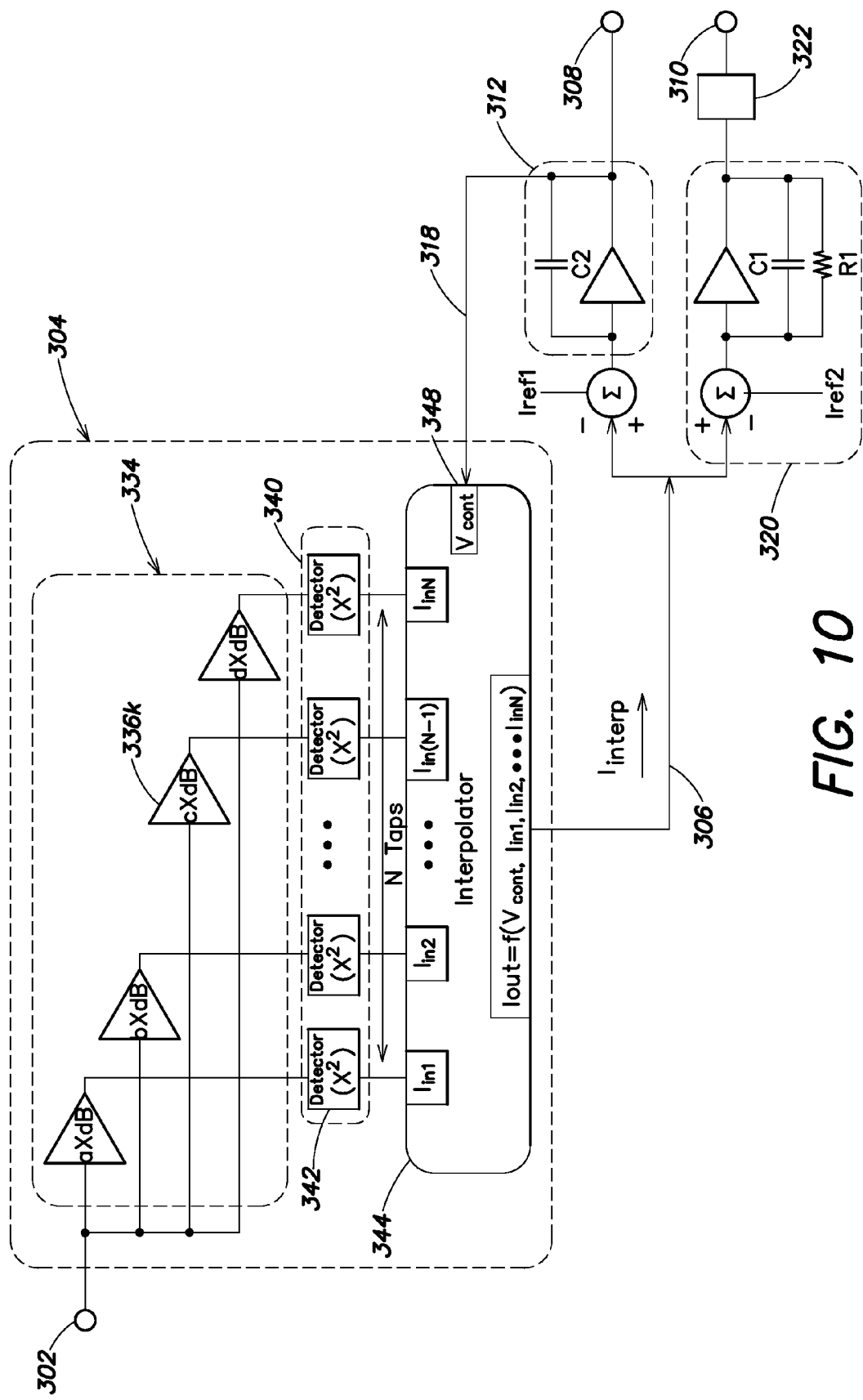
FIG. 10 is a block diagram of another example of an RF detector according to aspects of the invention.

For example, referring to FIG. 10, there is illustrated another example of an RF detector in which the gain stage 334 comprises a plurality of amplifiers 336k each having a gain that is a multiple of X dB (e.g., aX, bX, cX, ... nX). The gain coefficients (a, b, c ... n) may be integer or non-integer coefficients. As discussed above, the gain stage 334 may comprise any combination of amplifiers and/or attenuators, and therefore the example illustrated in FIG. 10 is not intended to be limiting and the gain stage 334 may additionally (or alternatively) include a number of attenuators each having a gain that is a multiple of −X dB. As illustrated in FIG. 10, in this example, the RF input signal is applied to each amplifier 336k in parallel, rather than in series (as in the example illustrated in FIG. 13). Thus, if there are N amplifiers 336k and if the gain coefficients (a, b, c ... n) are sequential integers (e.g., 1, 2, 3, etc.), then the gain stage 334 will generate N gain taps sequentially separated by X dB.

In one embodiment, each of the gain elements (amplifiers and/or attenuators) in the gain stage 334 is implemented differentially. However, it is to be appreciated that the invention is not so limited and single-ended implementation is also possible. Referring again to FIG. 9, in the illustrated example, each gain tap is buffered (using buffers 350) before driving the detector array 340. Tap separation may be stabilized over temperature and supply and process variations using appropriate biasing techniques. It is to be appreciated that although the buffers 350 are illustrated in FIG. 9 as being included with the chain of amplifiers 336 and chain of attenuators 338, the invention is not so limited and the buffers 350 may instead be considered as existing subsequent to the gain stage 334.

As illustrated in FIG. 7, a next step 508 may include detecting each of the gain taps produced by the gain stage 334. According to one embodiment, each buffered gain tap from the chain of amplifiers 336 and chain of attenuators 338 drives a detector 342 which provides a (differential or single-ended) output current. Thus, the detector array 340 produces (M+N+1) current outputs which are fed to the interpolator 344. Similarly, in the example illustrated in FIG. 10, the detector array 340 produces N current outputs which are fed to the interpolator 344. It is to be appreciated that although various inputs and outputs of the RF detector and its components may be described herein as currents or voltages, the invention is not so limited and any of these inputs and/or outputs may be easily converted from a voltage to a current, or vice versa, using techniques known to those skilled in the art. In one example, the detectors 342 are squaring detectors, and the output current signal from each detector may ideally vary as the square of the input voltage (i.e., the input gain tap). Thus, the step 508 of detecting the gain taps may include squaring the gain taps. The outputs 352 from the detector array 340 may be filtered by filters 354 prior to being fed to the interpolator 344, as illustrated in FIG. 9. In one example, the filters 354 may be low-pass filters and used to reduce RF frequency ripple on the signals.

As will be recognized by those skilled in the art, the detectors 342 may be implemented in various different ways, and may have fixed or variable scale factors, as discussed further below. In one embodiment, each detector 342 may be implemented as a common-emitter triplet cell, which may be chosen to have a high transistor ratio for extending the input voltage range over which a square-law output current may be obtained in practice. Similarly, the variable gain detection subsystem 334 may be implemented in various different ways, as also discussed further below.

Referring again to FIG. 7, the method may include, after the detecting step 508, a step 510 of selecting one or more of the detected (optionally squared) representations of the RF input signal. All the detectors 342 are driven by the gain taps corresponding to different signal levels, as discussed above, but only a small number of the detectors may be operating within their optimum square-law region. Large signals at the input of a detector 342 may drive the detector into its limiting region rather than the square-law region. Input signals that are too small may be masked by voltage offsets and noise that may be present in practical embodiments. Therefore, as discussed above, in one embodiment, the interpolator 344 is configured to select the output currents from those detectors 342 that are operating in their optimum square-law region. Selection may be performed using a series of fixed reference voltages and a single control voltage, $V_{cont}$, which is derived from the output of the integrator 312 and provided to the interpolator 344 at the control input 348, as discussed further below. Smooth, well-controlled interpolation of the outputs from adjacent detectors 342 as a function of the control voltage, $V_{cont}$, may be desirable for accurate logarithmic RMS signal level indication.

Figure 11A:
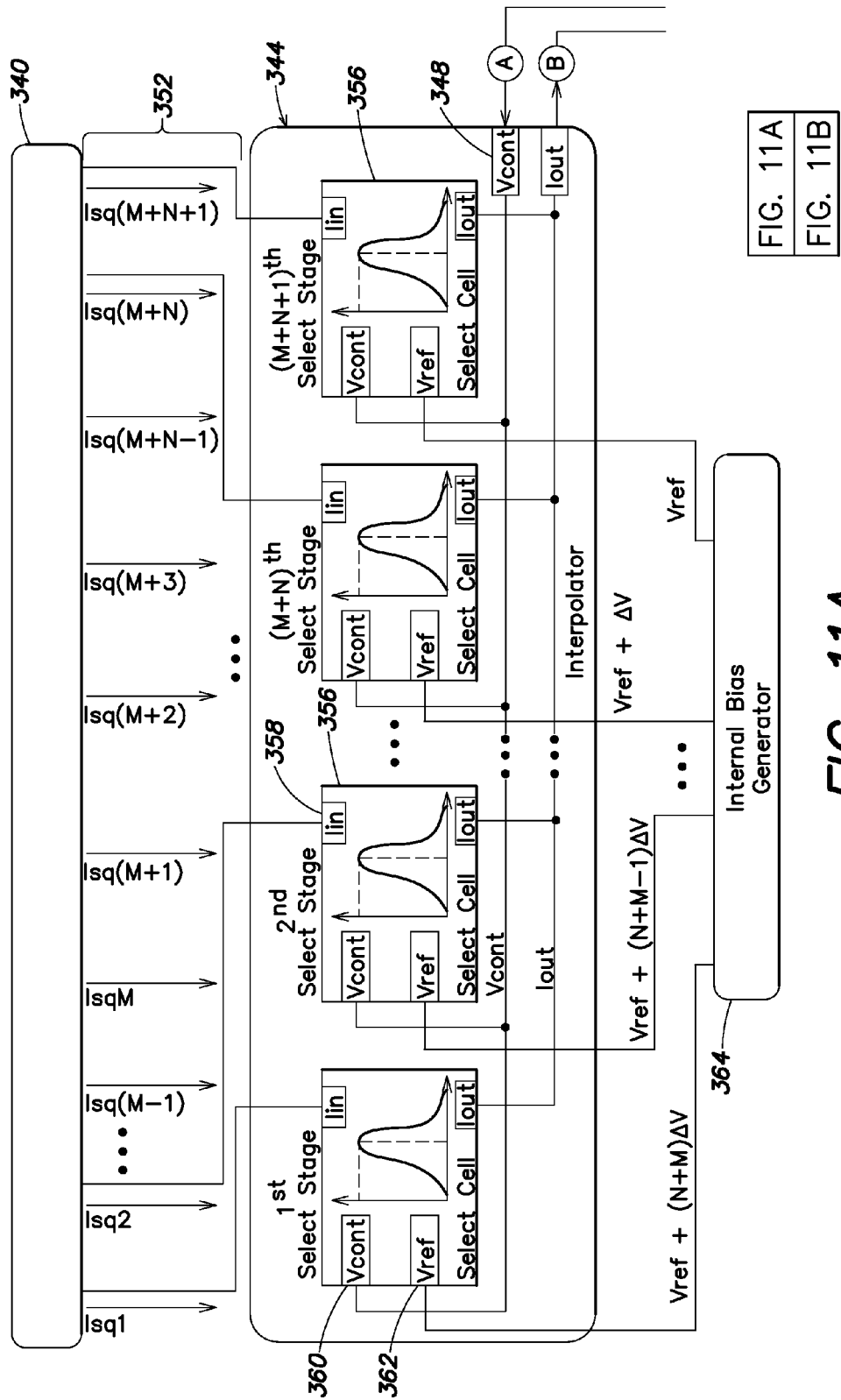
FIGS. 11A and B together are a block diagram of another example of a portion of an RF detector including an example of an interpolator, according to aspects of the invention.
Figure 11B:
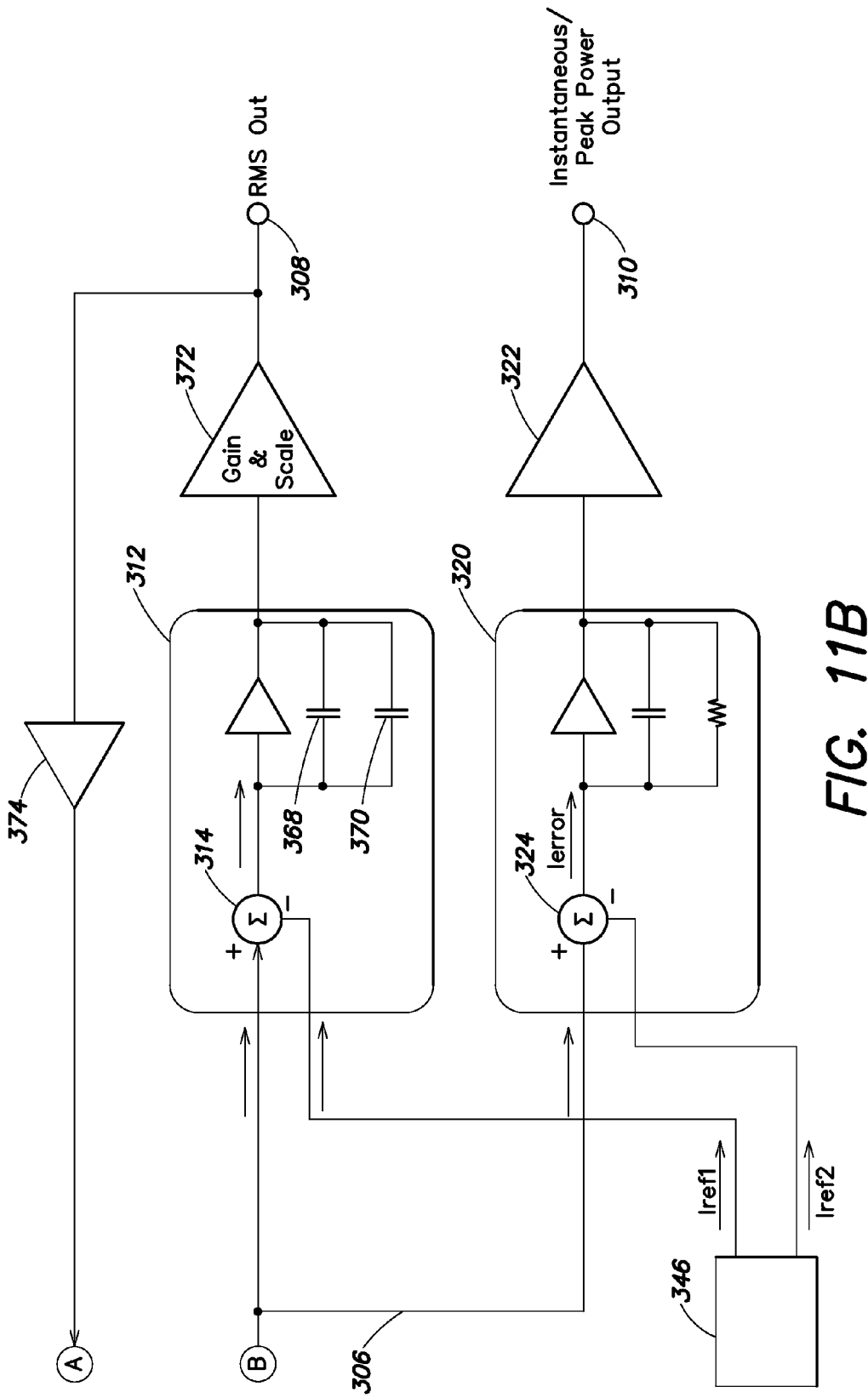

Referring to FIG. 11, there is illustrated a block diagram of an example of the RF detector, showing an example of the interpolator 344 in more detail. As discussed above, the interpolator 344 receives the (optionally filtered) outputs 352 from the detector array 340 of the variable gain detection subsystem 304 and is configured to select one or more of those outputs to be summed and output on line 306 to the integrator 312 and instantaneous power processing block 320. According to one embodiment, the interpolator 344 comprises a series of interpolator stages 356, one stage for each detector output. Thus, if the detector array 340 provides (M+N+1) outputs 352, the interpolator 344 may comprise (M+N+1) interpolator stages 356. In one example, each interpolator stage 356 has three inputs and receives the output of a detector (at input 358), the control voltage, Vcont, (at control input 360), and a fixed bias reference voltage (at bias input 362), as discussed further below. Also as discussed further below, the control voltage, Vcont, may be derived from the scaled or unscaled output of the integrator 312. The interpolator 344 may include (or be coupled to) a bias generator 364 which generates the series of fixed bias reference voltages applied to the interpolator stages 356, as also discussed further below. The outputs from all the interpolator stages 356 may be combined to provide the interpolator output current, Iout, (also referred to as the detector output signal) on line 306.

Figure 12:
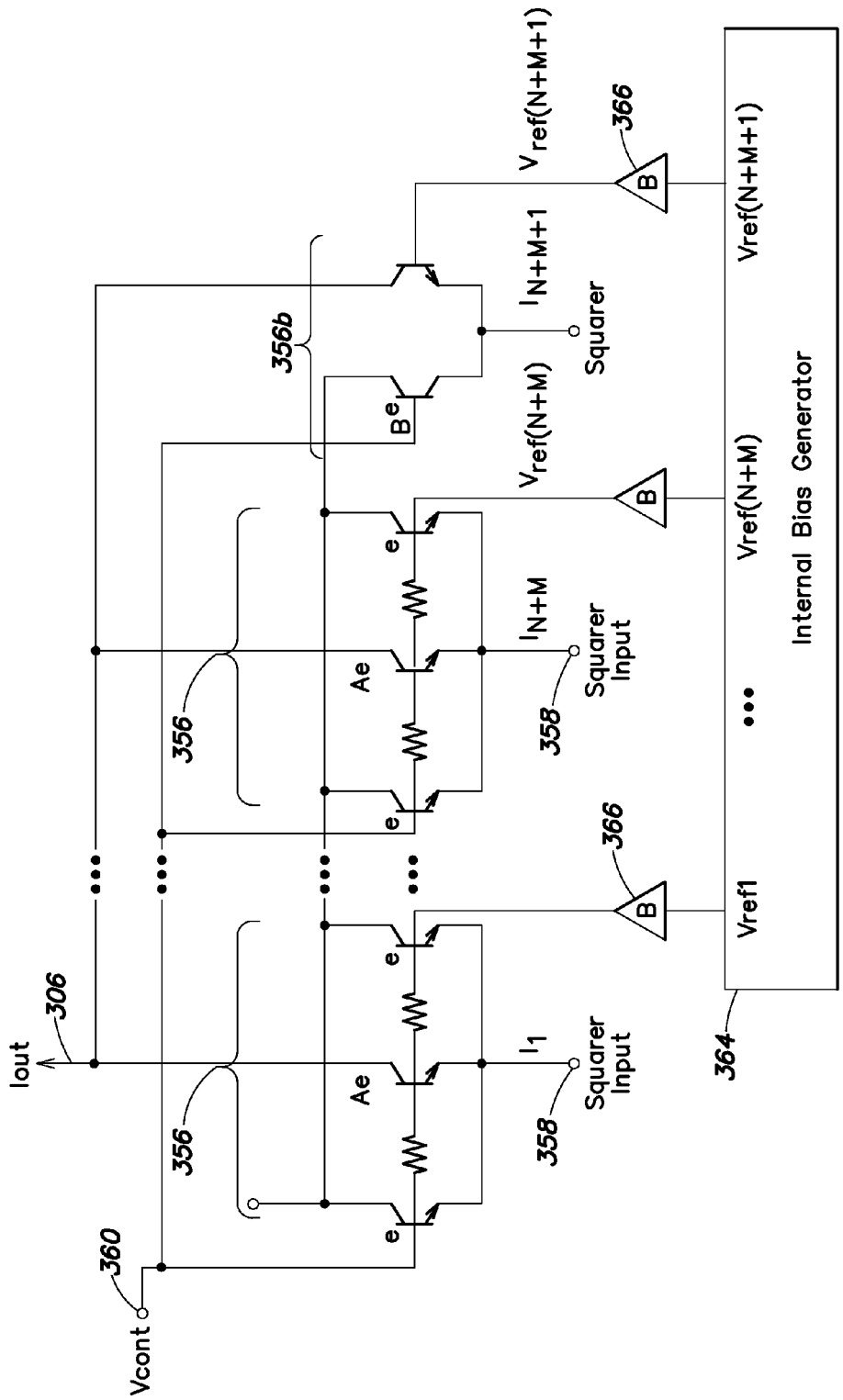
FIG. 12 is a diagram of one example of an interpolator according to aspects of the invention.

According to one embodiment, the interpolator stages 356 are implemented as controllable current amplifiers with the current outputs connected together, as illustrated in FIG. 12. Each interpolator stage 356 may receive the current from one of the detector outputs at the input 358. A specific amount of this received current may be transferred to the output line 306 (as Iout), and the control input 360 (which receives the control voltage, Vcont,) and bias input 362 of the interpolator stage 356 may be used to set the current gain of the interpolator stage. As illustrated in FIG. 12, in one example, all the control inputs 360 of the interpolator stages 356 are connected in common to the control voltage input terminal 348 of the interpolator 344. In one embodiment, when the control voltage, Vcont, is close to the bias reference voltage, Vref, for a given interpolator stage 356, the current gain for that stage may be maximum, and the gain may drop sharply when Vcont is either smaller or larger than Vref. Thus, the current gain of each interpolator stage weights the current from the respective detector 342. In one example, each interpolator stage 356 is configured to provide an output only when the control voltage is within a predetermined level of the bias reference voltage of that stage. For better accuracy of the overall logarithmic RMS power level indication (provided at the RMS output 308), the gain of each interpolator stage 356 as a function of the control voltage, Vcont, may be chosen not to be symmetrical around Vref.

As discussed above, the outputs from all the interpolator stages 356 are summed to provide the detector output signal, Iout. Each individual interpolator stage 356 has a current gain determined by the difference between the control voltage, Vcont, and the fixed bias reference voltage for the individual, Vrefi. Thus, those detector output currents 352 that are applied to interpolator stages 356 with relatively high current gains are selected by the interpolator 344. The currents from the selected detectors 342 are weighted by the current gain of the respective interpolator stages 356 and thus, the interpolator output current, Iout, may be considered a weighted sum of the outputs from selected detectors 342.

Referring again to FIGS. 11 and 12, in one example, the bias inputs 362 of the interpolator stages 356 are driven by buffered fixed reference voltages that are generated by the bias reference generator 364. Buffering may be provided by buffers 366 connected between the bias reference generator 364 and each bias input 362, as illustrated in FIG. 12. These fixed reference voltages may be separated from each other by an amount $\Delta V$, with the lowest reference voltage having a value Vofs. Thus, there may be (M+N+1) reference voltages, Vrefi, starting from Vofs and increasing sequentially by $\Delta V$ up to Vofs+(M+N)*$\Delta V$. Of course, it is to be appreciated that the sequence of reference voltages, Vrefi, may be reversed, such that the first reference voltage, Vref1, corresponds to the highest voltage (Vofs+(M+N)*$\Delta V$) and values of the reference voltages decrease sequentially by the amount $\Delta V$, such that Vref(M+N+1) is the lowest voltage, equal to Vofs. In this example, the lowest RF input signal requiring the largest gain may be represented by the lowest voltage at the RMS output 308. The absolute accuracies of these reference voltages, Vrefi, may directly affect the accuracy of the signals provided at the RMS output 308 and instantaneous power output 310. If the reference voltage separation $\Delta V$ is selected with care, when the control voltage, Vcont, is swept, the output of the interpolator 344 (i.e., the combined current, Iout, from all the interpolator stages 356 which is provided on line 306) may vary smoothly between K times the minimum detector tap current and K times the maximum detector tap current, where K is the scaling amount of the interpolator.

According to one embodiment, the interpolator 344 may comprise a second type of interpolator stage 356b that is different from other stages 356 that may receive a current from the detector 342 that is driven by the highest gain tap of the gain stage 334. In one embodiment, as shown in FIG. 12, when the control voltage, Vcont, is close to the fixed bias reference voltage, Vref, for this interpolator stage 356b, the current gain of the interpolator stage 356b may be close to the maximum and the gain may drop sharply when Vcont is larger than Vref while the gain will approach its maximum value when Vcont is smaller than Vref. In another embodiment, when the control voltage, Vcont, is close to the fixed bias reference voltage, Vref, for this interpolator stage 356b, the current gain of the interpolator stage 356b may be close to the maximum and the gain may drop sharply when Vcont is smaller than Vref while the gain will approach its maximum value when Vcont is larger than Vref. In this manner, the output of the interpolator 344 (which is provided on line 306) changes monotonically from minimum to maximum as a function of the Vcont level rather than tending towards a minimum value at both the highest and lowest levels of Vcont.

According to another embodiment, the detector array 340 and interpolator 344 may be designed to be temperature stable when used together in an embodiment of the RF detector. Temperature stability may be achieved using precise biasing circuits with specific temperature characteristics, as known to those skilled in the art.

Referring again to FIGS. 8 and 9, in another "thermometer" interpolator embodiment of the variable gain detection subsystem 304, currents from detectors 342 driven by gain/attenuator chain taps with signal levels above the optimum square-law region of the detector are suppressed, but the currents from those detectors 342 operating in their optimum square-law region are summed with the small, offset-driven currents from those detectors 342 connected to tap points with signals below optimum. These offset-induced currents may diminish the accuracy of this interpolation scheme, but this embodiment may allow the instantaneous power output 310 to provide logarithmic peak amplitude measurement of short RF power level spikes well beyond the square-law dynamic range of the individual detectors 342. This may be a useful feature in some fault- or interference-monitoring applications. In one embodiment of the "thermometer" interpolator, the interpolator stages 356 in FIG. 12 may be replaced by stage type 356b. The current gain of all these interpolator stages would then be high when the control voltage is below the fixed bias reference voltage for a given stage, i, (that is, for Vcont<Vrefi) and drop sharply as the control voltage goes above the bias reference voltage (i.e., for Vcont>Vrefi).

Referring again to FIG. 11, the control voltage, Vcont, applied to the interpolator stages 356 may be derived from the scaled or unscaled output of the integrator 312, which in turn receives, on line 306, the output from the interpolator 344. Thus, the RF detector may comprise a feedback loop that includes the interpolator 344 and the integrator 312. In one embodiment, the integrator 312 comprises the comparator 314 that detects a difference between the detector output current, Iout, supplied on line 306 and the reference current, Iref1, provided by the reference generator 346. In one example, the comparator 314 is a current comparator. However, as discussed above, it is to be appreciated that any signal referred to herein as a current may be easily replaced with a corresponding voltage and therefore, the comparator may receive an output voltage from the interpolator 344 and a reference voltage and may be a voltage comparator.

Still referring to FIG. 11, the comparator 314 may generate an error current, Ierror, based on the difference between Iout and Iref1. This error current may be used to charge or discharge the integration capacitance, depending on the direction of the error. The integration capacitance may include one or more capacitors 368, 370. Additional capacitance may be added to the integrator 312 if higher integration time constants are desired or needed to get a constant RMS power level indication as a function of the modulation bandwidth of the RF input signal. The integrator 312 averages the signals from the detectors 342 selected by the interpolator 344 and provided to the integrator 312 on line 306 (step 512 in FIG. 7). An output amplifier 372 may be used for buffering, gain-scaling and/or DC-offset adjustment of the signal that is provided at the RMS output 308. In one example, the output amplifier 372 may provide suitable current buffering and output voltage swing capability to drive an external load that may be connected to the RMS power output 308. In one example, a loop amplifier 374 is used to provide further scaling and/or buffering of the integrator output as may be needed or desired to drive the control input 348 of the interpolator 344. Furthermore, it is to be appreciated that either amplifier 372 and/or amplifier 374 may be implemented as a cascade of two or more amplifiers, as would be recognized by those skilled in the art. Thus, a feedback control loop is formed involving the interpolator 344, the integrator 312 and the amplifiers (gain/scale buffers) 372 and 374.

According to one embodiment, the integrator 312 has a large gain (although not an infinite gain, due to circuit non-idealities that would exist in practical embodiments). This large gain in the feedback loop forces the detector output current, Iout, to be the same (or nearly the same) as the integrator reference current, Iref1, as discussed above. When an RF signal is applied to the input 302 (see FIG. 8) of the RF detector, or when the RMS level of the applied RF input signal changes, the integrator 312 adjusts the control voltage, Vcont, applied to the interpolator 344 and receives the corresponding weighted sum of the currents from all the detectors 342 selected by the interpolator. The feedback loop may reach a steady state condition when the control voltage, Vcont, drives the interpolator 344 to select those detectors 342 with a weighted average output approximately equal to the reference current, Iref1.

In one example, the interpolator 344 selects the outputs of the detectors 342 which are operating at (or close to) the optimum squaring point, that is, those detectors 342 which provide an accurate representation of the square of the RF input signal voltage. As discussed above, this representation of the square of the RF input signal voltage may be obtained regardless of the wave shape of the RF input signal. In one example, when this result is achieved by selecting a correct scaling (provided by a combination of the interpolator 344 and the amplifiers 372, 374) and reference current, Iref1, value, the majority of the interpolator output current, Iout, may be supplied by one or two detectors 342. Thus, by selecting from all the detectors 342 provided in the RF detector only those detectors 342 operating in their square-law region for a given RF input signal power level, a measurement of the mean-square power level of the RF input signal may be obtained over a range of RF input signal power levels that may far exceed the square-law (dynamic) range of any single detector 342. The interpolator 344 may thus select the detector(s) whose output provide the broadest peak to average signal power range for accurate square law operation over a wide range of RF input power levels.

According to one embodiment, when the output of the integrator 312 stabilizes to its steady-state condition, the value of the control voltage, Vcont, determines which detector outputs 352 are selected by the interpolator 344. Thus, by the design of the RF detector, the mean-square value of the gain taps to these detectors 342 is known. In one example, an X dB change in the signal level of the RF input signal, X dB also being the gain/attenuation tap ratio (as discussed above), forces the interpolator-integrator feedback loop to select a consecutive interpolator stage 356. Since this may correspond to a shift of ΔV at the control input 348 of the interpolator 344 (as discussed above), the control voltage, Vcont, may change linearly for logarithmic change in the mean-square voltage level of the RF input signal. The root operation to obtain the RMS output signal from the mean-square signal level may be implemented through gain-scaling, for example, by the amplifier 372. The logarithm of the root of the mean-square value of the RF input signal is equal to half the logarithm of the mean-square value of the RF input signal. Thus, at the RMS output 308, the RF detector may provide an accurate representation of the RMS power level of the RF input signal over a wide dynamic range (step 514). An additional summing and amplifier circuit (not shown in FIG. 8) may optionally be connected to output 308 to act as a buffer preventing an external load from disturbing the integrator-interpolator feedback loop. The summing circuit allows an external power level control signal to be subtracted from the signal at output 308, thereby allowing the RF power detector to operate as a controller in a power leveling loop.

In one embodiment, the accuracy of the RF detector may depend on the stability of amplifier/attenuator gain in the variable gain detection subsystem (304), and on the absolute value of the fixed reference voltages at the bias inputs 362 of the interpolator stages 356. With knowledge of how much gain is available from the gain stage 334, the exact logarithmic RMS value of the RF input signal may be absolutely provided by the control voltage, Vcont, with appropriate offset compensation and/or gain scaling from the amplifier 372.

Figure 13:
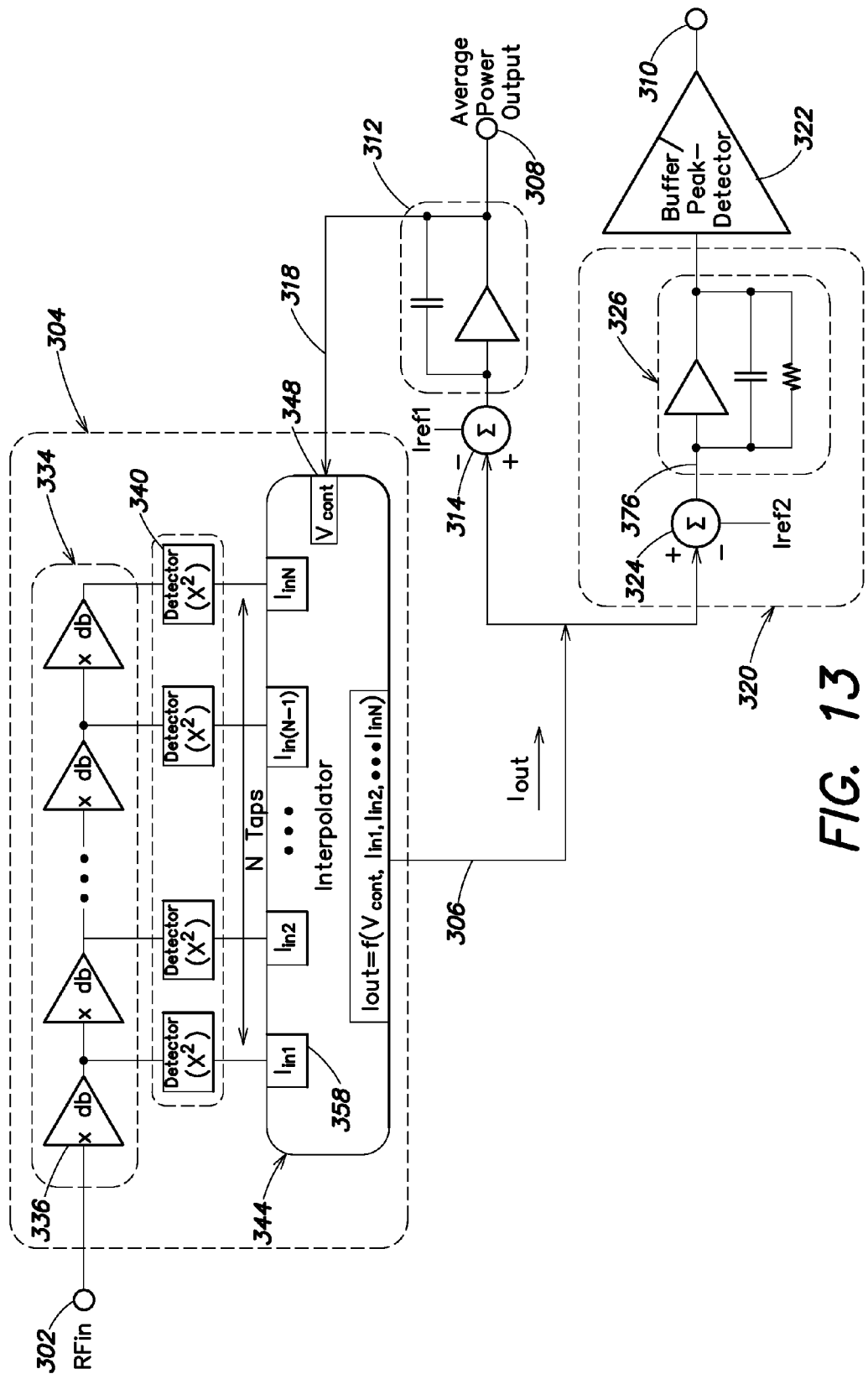
FIG. 13 is a block diagram of another example of an RF detector according to aspects of the invention.

Referring to FIG. 13, there is illustrated another example of an RF detector including the RMS output 308 and the instantaneous power output 310. As discussed above, the gain stage 334 may be implemented in a variety of ways and FIG. 13 illustrates another variation in which the gain stage 334 comprises a plurality of serially connected amplifiers 336. However, it is to be appreciated that any of the illustrated variations (or any of numerous other variations) of the gain block 334 may be used in any embodiment of the RF detector.

Accurate RMS power calculation for signals with complex modulation schemes, such as discussed above, may require a long integration time to include the time-varying envelope in the measurement. Therefore, the integration time constant associated with the integrator 312 may be chosen to be relatively long. By contrast, a low-pass filtering time constant for the instantaneous power processing block 320 (in the instantaneous power detection channel) may be chosen so as to suppress fact AC current fluctuations that may be induced by the RF carrier signal while also being sufficiently short so as to follow slower current variations that may be driven by amplitude changes in the carrier modulation envelope. In one example, the instantaneous power processing block 320 provides an output current, and this output current may be easily transformed into a voltage using a simple resistor network, as known to those skilled in the art. This transformed voltage output of the instantaneous power processing block 320 may provide an indication of the instantaneous amplitude modulation on the RF input signal. Furthermore, as discussed above, since it is being generated by the gain tap point(s) selected by the RMS power detection loop, the voltage amplitude will be scaled by the RMS power of the RF carrier. Accordingly, the voltage signal from the instantaneous power processing block 320 may provide a direct indication of the instantaneous to average power ratio of the RF input signal modulation over a wide range of average RF power levels. Furthermore, in one embodiment, the instantaneous power level indication, provided from the instantaneous power processing block 320 at the instantaneous power output 310 (step 516), will be accurate for large modulation crest factors because the instantaneous power processing block 320 is being driven by detectors 342 operating in their optimum square-law region. In another embodiment, with the "thermometer" interpolation scheme discussed above, the instantaneous power level indication range may be extended to provide a logarithmic-peak power indication for modulation crest factors many orders of magnitude larger than the square-law dynamic range of the individual detectors 342.

Figure 14:
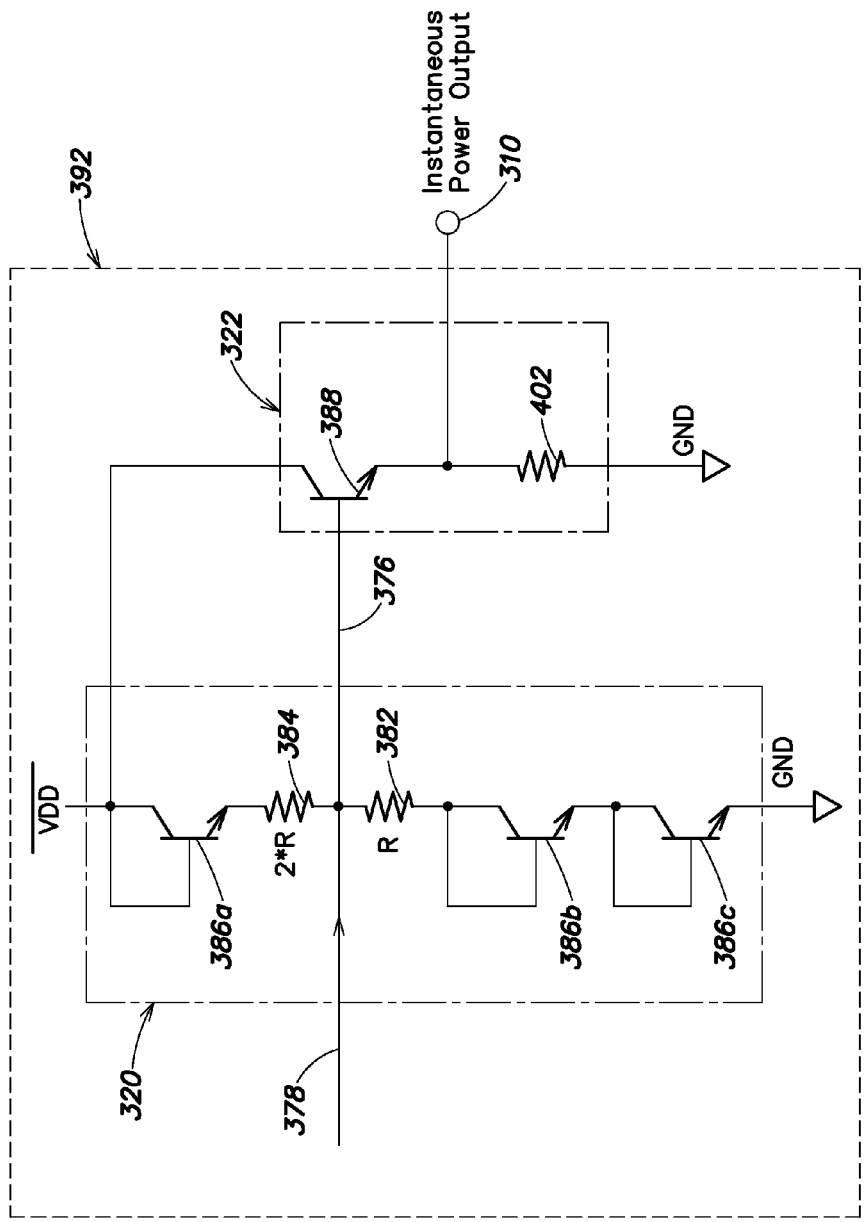
FIG. 14 is a circuit diagram of one example the instantaneous power processing block and an output buffer according to aspects of the invention.

Referring to FIG. 14, there is illustrated one example of an implementation of the instantaneous power processing block 320 and output block 322, illustrated collectively as block 392. As discussed above, the instantaneous power processing block 320 receives a copy of the detector output signal from line 306 on its input line 378. In one example, the instantaneous power processing block 320 includes, or is coupled to, the comparator 324 (see FIG. 4) which receives the detector output signal on line 306 and compares it to a reference current, Iref2, (e.g., by subtracting the reference current from the detector output signal or vice versa) to generate an error signal that is input on line 378 to drive the stage of the instantaneous power processing block 320 illustrated in FIG. 14. Therefore, it is to be appreciated that the signal supplied on line 378 may be the detector output signal from line 306 (optionally scaled or level-shifted) or the error current generated by comparator 324. As discussed above, in one example, the reference current, Iref1, may be equal to the reference current, Iref1, that is subtracted from the detector output signal by comparator 314 in the average power detection channel. In this example, the input current on line 378 of the instantaneous power processing block 320 will be nearly zero when the RF input signal at input terminal 302 is not amplitude modulated.

According to one embodiment, the instantaneous power processing block 320 performs a current-to-voltage conversion on the input signal on line 378 in the network comprising resistors 382 and 384 and the transistors 386a, 386b and 386c. In one example, these transistors 386a, 386b and 386c are BJT transistors, as illustrated in FIG. 14, but it is to be appreciated that they may be alternatively implemented as FET transistors. The resulting voltage on line 376 is supplied to the output block 322. As discussed above, in one embodiment, the signal provided at the instantaneous power output 310 is a representation of the instantaneous power of the input RF signal normalized to the mean power of the input RF signal. In this embodiment, the output block 322 comprises a transistor 388 in a follower configuration to buffer the voltage received on line 376. The transistor 388 is properly biased using the resistor 402 which may be internal, external or partially external (for example, if multiple physical resistors are used to implement the representative resistor 402) to the output block 322. In the illustrated embodiment in FIG. 14, the configuration of transistors 386a, 386b and 386c and the resistors 382 and 384 cancels the temperature variation of the base-emitter voltage of the follower transistor 388 resulting in a temperature stable (or nearly temperature stable) instantaneous power output signal at the instantaneous power output 310.

Figure 15A:
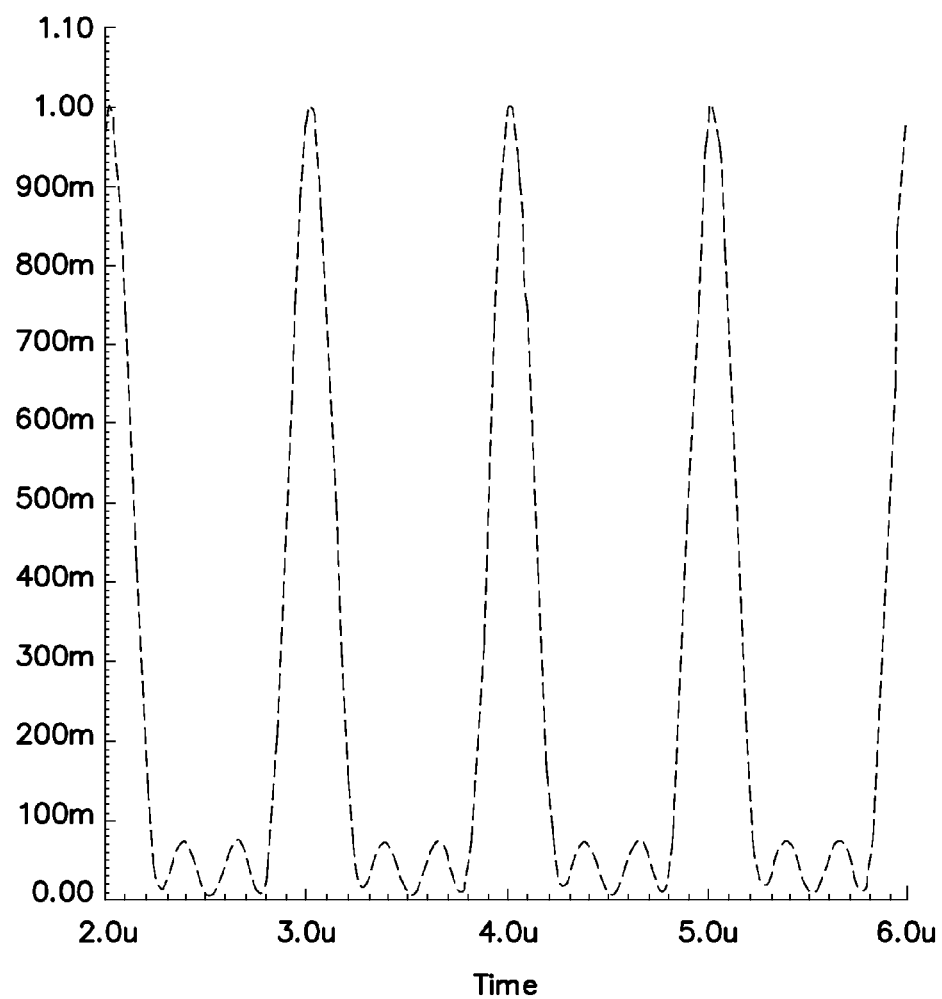
FIG. 15A is an illustration of an example of an output signal provided at the instantaneous power output of one embodiment of the RF detector according to aspects of the invention.
Figure 15B:
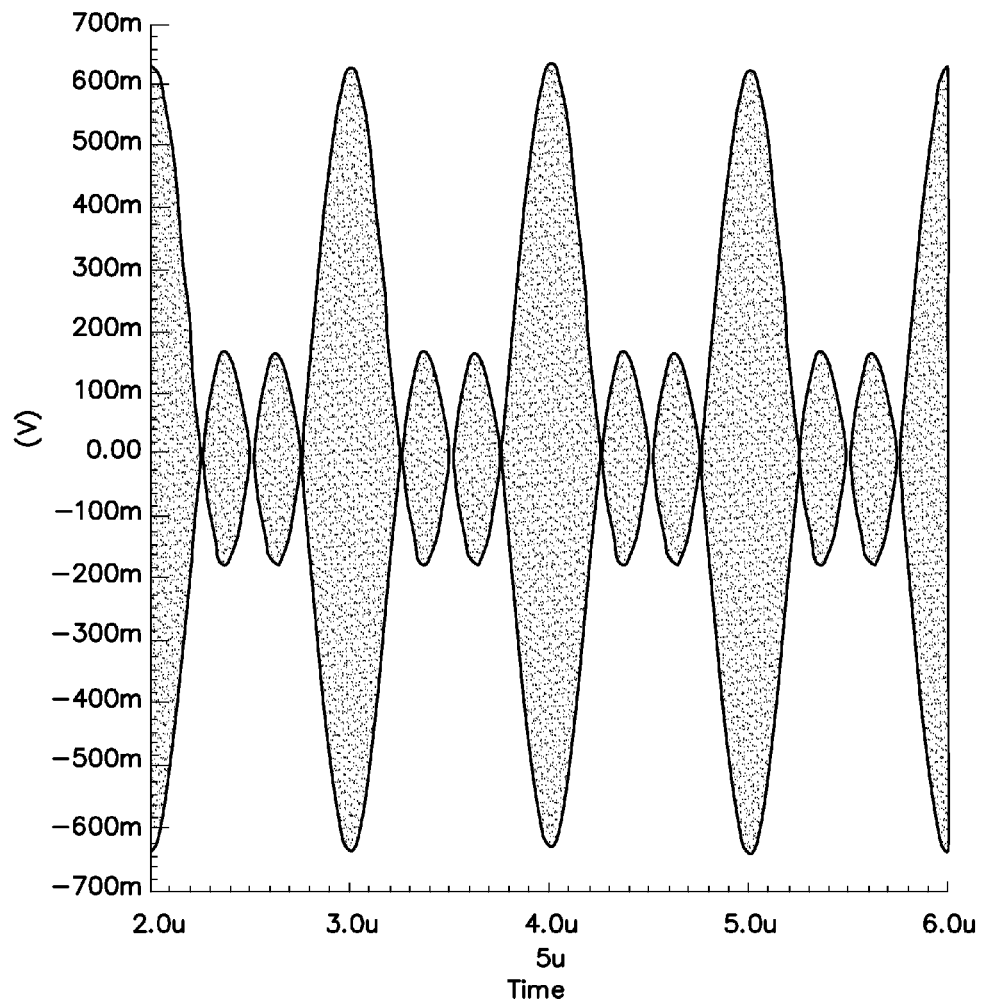
FIG. 15B is an illustration of an example of an RF input signal corresponding to the output signal illustrated in FIG. 15A.

Referring to FIG. 15A, there is illustrated a plot of one example of a signal provided at the instantaneous power output 310 of an embodiment of the RF detector. In the example shown in FIG. 15A, the RF input signal applied at terminal 302 was a 4-tone signal with a crest factor of 9.04 dB as illustrated in FIG. 15B. As discussed above, and as can be seen in FIG. 15A, in this example, the voltage provided at the instantaneous power output follows the amplitude modulation shape of the RF input signal, normalized to the average power level of the RF input signal.

Figure 16:
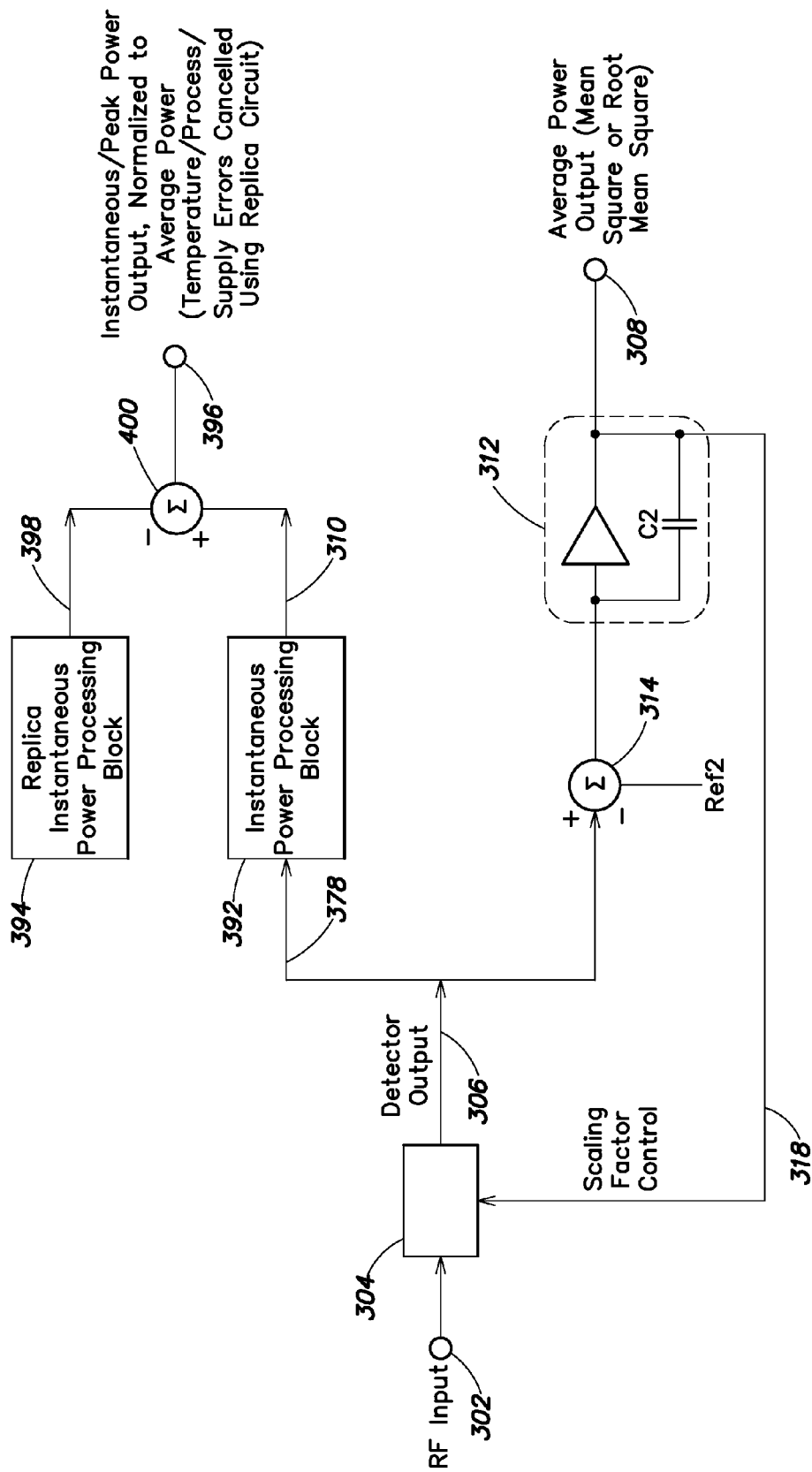
FIG. 16 is a block diagram of another example of an RF detector according to aspects of the invention.

In one embodiment, a replica 394 of the block 392 may be used as a reference to compensate for temperature, process and supply variations, as illustrated in FIG. 16. In the illustrated example, the replica block 394 does not receive any input signal and thus provides an output voltage that is equivalent to the output voltage of the block 392 when there is no input current received on line 378. Accordingly, the signal provided from the replica block 394 on the output line 398 will be a DC level that varies with temperature, supply and process variations. Because the replica block 394 is a copy of the block 392, temperature, process and supply variation related errors in the instantaneous power output signal on line 310 may be cancelled by the subtraction of the reference output signal on line 398 using summer 400. As discussed above, in one example where Iref1 is approximately equal to Iref1, the difference of the instantaneous power output signal on line 310 and instantaneous power reference signal on line 398 may be nearly zero if the input RF signal does not have any amplitude modulation. Accordingly, the difference signal provided at output 396 may provide a representation of the instantaneous power of the input RF signal normalized to the mean power of the input RF signal with the average of this difference signal being near zero. In another embodiment, if Iref2 is also applied to port 378 of replica block 394, the difference of the instantaneous power output signal on line 310 and reference signal on line 398 will correspond to a fixed value representative of the reference level for the average power normalization. Accordingly, the difference signal provided at output 396 may provide a representation of the instantaneous power of the input RF signal normalized to the mean power of the input RF signal with the average of this difference signal being at the reference level for the average power normalization.

Figure 17:
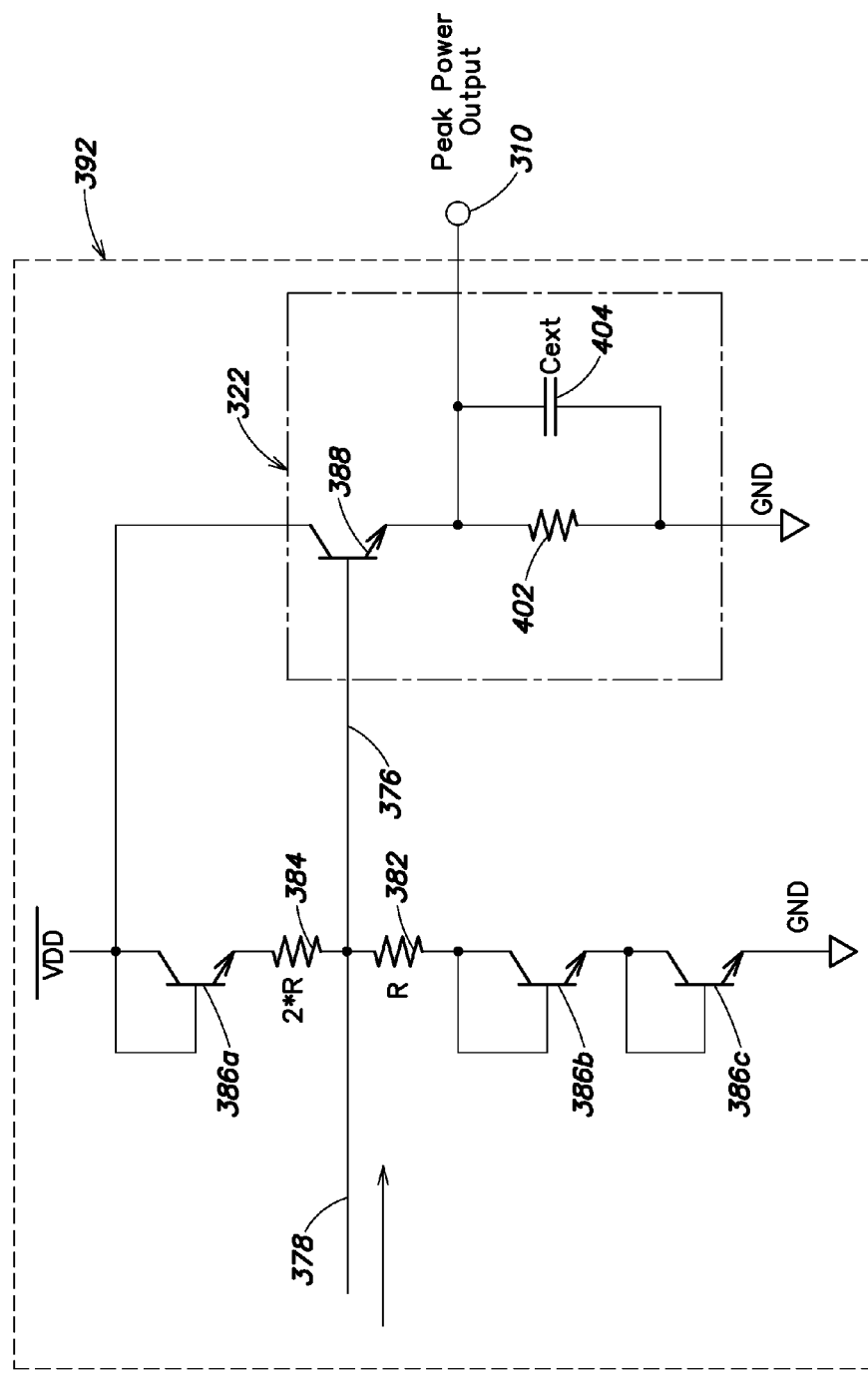
FIG. 17 is a circuit diagram of an example of the instantaneous power processing block and an output peak detector according to aspects of the invention.

As discussed above, in another embodiment, the signal provided at the instantaneous power output 310 may be representative of the peak power level of the RF input signal, normalized to the average power of the RF input signal. Accordingly, the output block 322 may include a peak detector that can be used to generate the peak power output normalized to the average power, also defined as the crest factor of the RF input signal. Referring to FIG. 17, there is illustrated another example of the instantaneous power processing block 320 and output block 322 in which the output block 322 includes a peak detector. As discussed above with reference to FIG. 14, this block 392 performs a current-to-voltage conversion on the signal received on line 378 using the network comprising resistors 382 and 384 and transistors 386a, 386b and 386c. FIG. 14 illustrates these transistors as BJTs, but it is to be appreciated that they may be alternatively implemented as FET transistors. In one example, the transistor 388, with its base receiving the resulting voltage on line 376, is used in a follower configuration with a large biasing resistor 402 and a capacitor 404 connected to the emitter of the transistor 388. The biasing resistor 402 in this case is much larger than the corresponding resistor 402 in FIG. 14 buffer stage configuration, so the quiescent current through transistor 388 is much smaller. As a result, this transistor charges-up capacitor 404 during peaks in the input RF signal power, but it turns off (acts as a rectifier) as the RF power drops below the peak value. Thus voltage corresponding to the peak RF power level is maintained on capacitor 404 with a time constant related to the product of the values of resistor 402 and capacitor 404. Both resistor 402 and capacitor 404 may be internal or external, or any combination thereof, to the output block 322. In the configuration illustrated in FIG. 17, the block 392 provides at the instantaneous power output 310 a peak power output signal that is a representation of the peak power of the input RF signal normalized to the mean power of the input RF signal. The ratio of the peak power to mean power is defined as the crest factor.

Thus, in one embodiment, a signal representative of the crest factor of the RF input signal may be provided at the instantaneous power output 310. In this embodiment, the normalization (or "division) of the peak power by the average power occurs without the need for an accurate divider, as is needed in the conventional system discussed above with reference to FIG. 1A, which may greatly simplify the circuit and/or improve the accuracy of the crest factor measurement. Furthermore, in one embodiment, because the same detector array in the variable gain detection subsystem 304 is used for both the RMS power measurement and instantaneous power measurement, part-to-part and temperature variation issues between the RMS power detection channel and the instantaneous power detection channel, which can be problematic in conventional systems, as discussed above, are eliminated. The use of the same detector array also provides similar dynamic range performance for both the average power detection function and the instantaneous power detection function. In addition, the RF detector circuitry may be simplified compared to conventional systems by the sharing of components, such as the detector array, among the two detection channels.

Referring again to FIG. 16, it is to be appreciated that the block 392 and replica block 394 may be implemented as illustrated in FIG. 17. Thus, in similar fashion to the instantaneous power configuration discussed previously, the difference of the peak power output signal on line 310 and peak power reference output signal on line 398 may provide at output line 396 a representation of the peak power of the input RF signal normalized to the mean power of the input RF signal, with temperature, process and supply variation related errors in the peak power output signal on line 310 cancelled by the subtraction of the peak power reference output signal on line 398.

Figure 18:
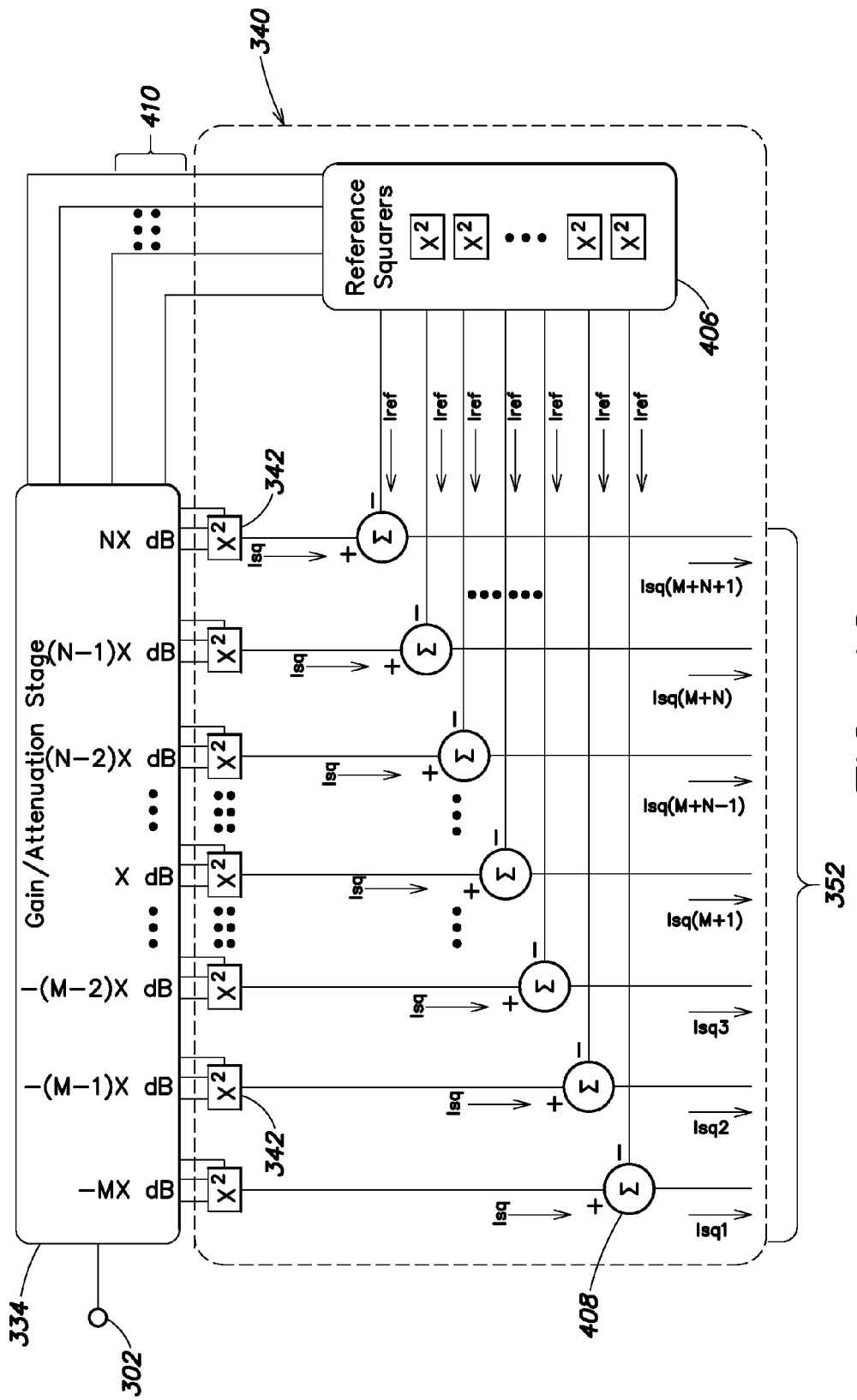
FIG. 18 is a block diagram of an example of a portion of a variable gain detection subsystem according to aspects of the invention.

As discussed above, it will be recognized by those skilled in the art that the RF detector, and its various components, may be implemented in a variety of ways, not limited to the above-discussed examples. For example, the detector array 340 may be modified to include a series of reference detectors (optionally, reference squarers) 406, as illustrated in FIG. 18. The array of reference detectors 406 may receive various bias points 410 from the gain stage 334. The outputs, Iref, from the reference detectors 406 may be fed to summers 408, which receive detected signals from the detectors 342. The reference signals, Iref, may be subtracted from the detector 342 output signals in the summers 408 to cancel process and temperature variations. The output signals from the summers 408 may be fed as signals 352 to the interpolator 344, as discussed above. In one example, one reference detector 406 may be provided for each detector 342. Alternatively, two or more detectors 342 may share the same reference detector 406, resulting in fewer numbers of reference detectors being used.

Figure 19:
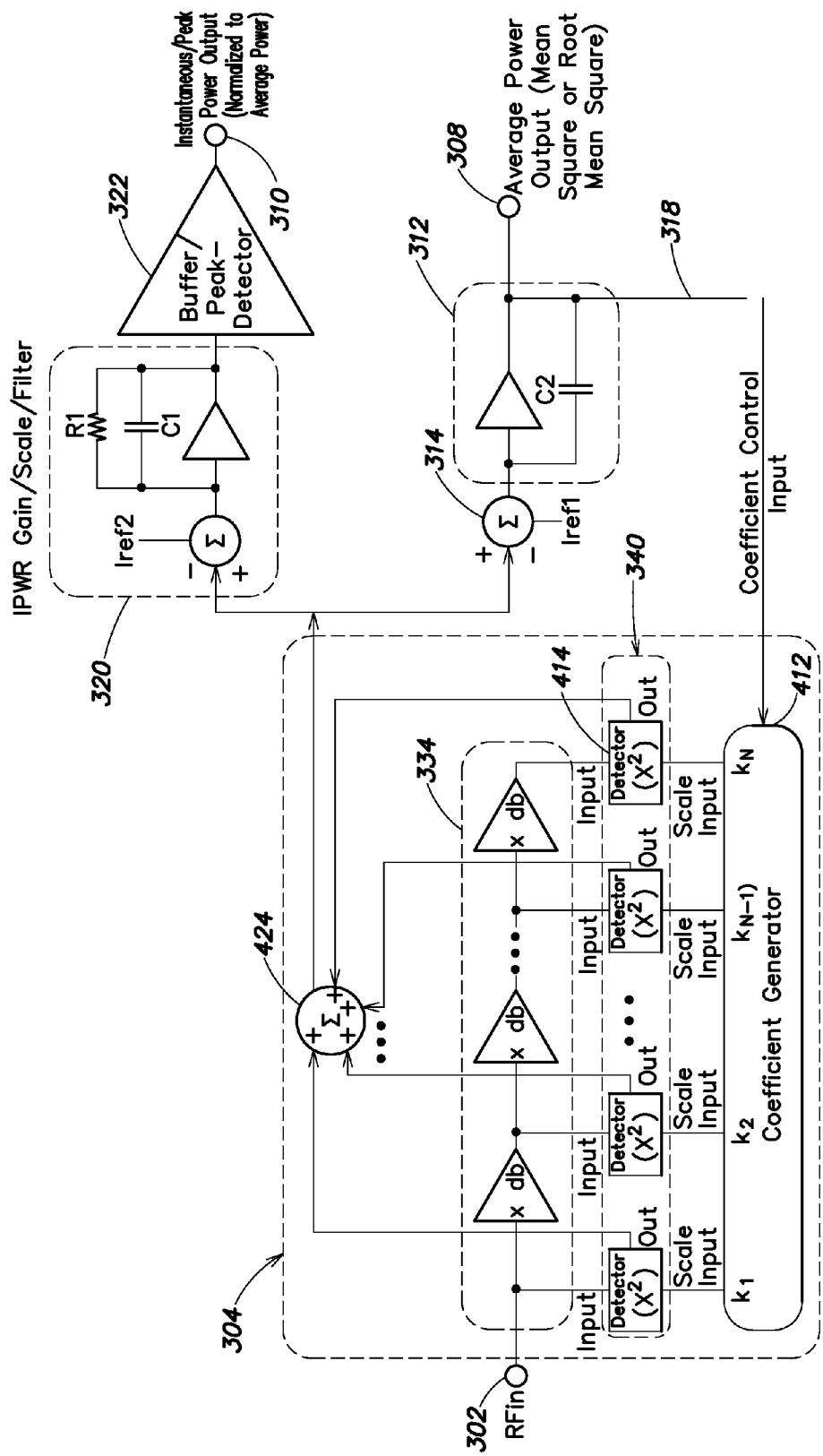
FIG. 19 is a block diagram of another example of an RF detector according to aspects of the invention.

Referring to FIG. 19, according to another embodiment, the interpolator 344 may be replaced with a coefficient generator 412 which generates scaling coefficients responsive to the average power output (i.e., the feedback signal) on line 318. In this example, the detector array 340 may include squaring RF detectors 414 which have a variable gain factor. Thus, each detector 414 may output the square of the received input signal, adjusted or weighted by the gain factor of the detector. The scaling coefficients from the coefficient generator 412 may be used to set the gain factors of the detectors 414 in the detector array 340. The outputs from the detector array 340 may be summed in summer 424 to generate the detector output signal on line 306 that is provided to the integrator 312 (for the average power detection channel) and the instantaneous power processing block 320. The coefficients may be configured so as to "select" (for example, by gain-scaling) one or more of the detector 414 outputs, similar to the technique discussed above with reference to the interpolator. For example, the gain coefficients may be configured so as to select the outputs from those detectors 414 operating within their optimum square-law region.

Figure 20:
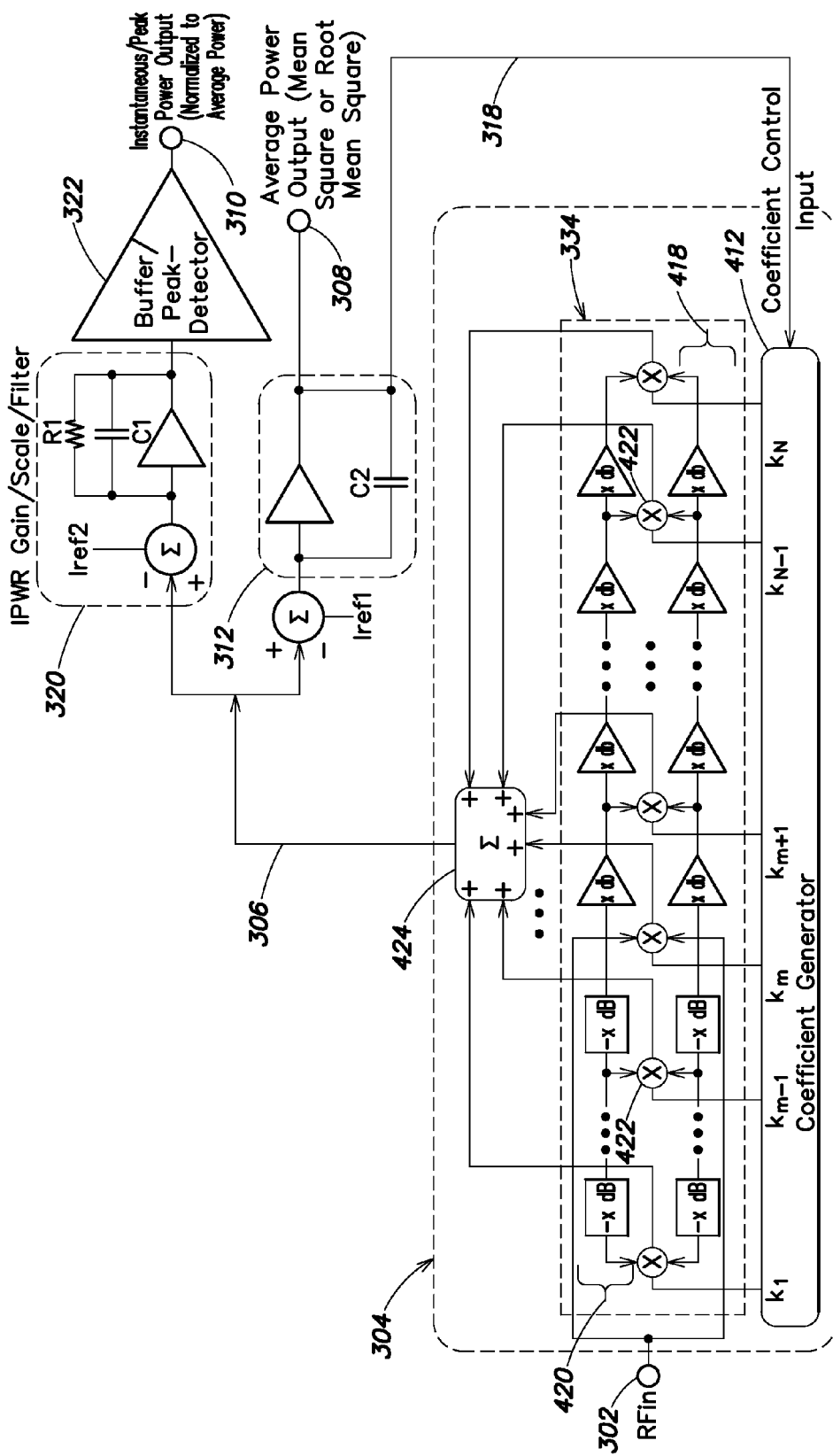
FIG. 20 is a block diagram of another example of an RF detector according to aspects of the invention.

According to another embodiment, the variable gain detection subsystem 304 may include dual chains of amplifiers/attenuators 418, 420, as illustrated in FIG. 20. The gain taps from each pair of amplifiers/attenuators (i.e., pairs formed from one amplifier/attenuator from each chain 418, 420) may be multiplied together in multipliers 422 which have a variable scale factor and summed in the summer 424 to provide the signal on line 306. Thus, if the two gain taps forming each pair are similar, a squaring operation may be achieved by the multiplication. Accordingly, the multipliers 422 may be used in this embodiment instead of squaring detectors with the multipliers receiving coefficients generated in the coefficient generator 412. The scaling coefficients from the coefficient generator 412 may be used to set the scaling factors of the multipliers 422.

In summary, several variations, aspects and embodiments of an RF detector have been discussed. The RF detector may provide two outputs, one being a function of the true RMS power level of an RF input signal, and the other being a function of the instantaneous/peak power of the RF input signal, normalized to the average power level. These outputs may be stable with variations in temperature and supply voltage. The RF detector may thus optionally also provide a measurement of the crest factor of the RF input signal, which may be useful in a variety of applications. The RF detector may provide accurate measurements of the RF input signal power even in the presence of complex modulation schemes. In one embodiment, by using multiple detectors, and selecting those detectors operating in their square-law region, the dynamic range of the RF detector may be greatly extended up to a maximum level that is dependent on the number of detection stages. Furthermore, because the same variable gain detection subsystem can be used for both the average power measurement and instantaneous/peak power measurement, the same (or very similar) dynamic range may be achieved for both measurements. In one example, the RF detector provides an input dynamic range of about 70 dB and may provide accurate RMS power measurement over an input frequency range of about 100 MHz to 3.9 GHz and over various modulation standards, including CDMA, TDMA and GSM. The RF detector may provide a linear-in-dB output, which is one embodiment is scaled by 37 millivolts per dB. The RF detector may be implemented using SiGeCMOS IC process technology and may be provided as an integrated circuit in a leadless SMT package. The following table provides some example specifications for one example of an embodiment of the RF detector, measured at room temperature:

TABLE 1

| Parameter | Measured Data | Units |
|---|---|---|
| Input Frequency Range | 0.1 to 3.9 | GHz |
| Input Dynamic Range (to 1 dB measurement error, @ | | |
| 100 MHz | 71 | dB |
| 900 MHz | 70 | dB |
| 1900 MHz | 70 | dB |
| 2700 MHz | 66 | dB |
| 3500 MHZ | 52 | dB |
| RSSI Slope (@ 1900 MHz) | 37.4 | mV/dB |
| RSSI Intercept Input Level (@ 1900 MHz) | −68 | dBm |
| Output Error with Temperature | +−1 | dB |
| Output Deviation for 256 QAM Modulation | 0.1 | dB |
| Instantaneous Power Output Temp. Sensitivity | 312 | ppm/° C. |
| Instantaneous Power Output Modulation BW (3 dB) * | 40 | MHz |
| Min. Input Return Loss (50 Ohm) ** | 10 | dB |
| Bias Voltage (Vcc) - nominal | 5 | V |
| Min/Max range | 4.5-55 | V |
| Current (Icc) | 67-84 | mA |
| Operating Temperature Range | −40 to +85 | ° C. |

* At 900 MHz, −20 dBm RF Power, 4-tone input signal, 3 dB reduction in measured swing.
** Measured with balun up to 2.4 GHz. Input Return Loss is limited by Balun.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A power detector comprising:
an input configured to receive an input signal;
one squaring detector coupled to the input and configured to detect the input signal and to provide a detector output signal;
an averaging circuit coupled to the squaring detector and configured to receive the detector output signal and to provide a first signal which is representative of an average power level of the input signal;
an instantaneous power processing device coupled to the squaring detector and configured to receive the detector output signal and to provide at an output of the power detector an instantaneous power output signal which is representative of the instantaneous power level of the input signal normalized to a representation of the average power level of the input signal.

2. The power detector of claim 1, wherein the averaging circuit is further configured to receive a reference signal and to adjust a scaling factor of the squaring detector based on an average difference between the detector output signal and the reference signal to adjust an average of the detector output signal to a level approximately that of the reference signal.

3. The power detector of claim 1, further comprising a bias control circuit coupled between the averaging circuit and the squaring detector, the bias control circuit being configured to receive the first signal and to provide a detector gain control signal to the squaring detector, the detector gain control signal controlling scaling of the squaring detector based on the first signal.

4. The power detector of claim 1, further comprising a variable gain amplifier coupled between the input and the squaring detector, the variable gain amplifier being configured to receive the first signal and to provide an amplified output signal;
wherein a gain of the variable gain amplifier is controlled by the first signal; and
wherein the squaring detector is configured to receive the amplified output signal.

5. The power detector of claim 1, wherein the instantaneous power processing device comprises:
a transistor follower configured to receive the detector output signal and to provide the instantaneous power output signal; and
a network coupled to the transistor follower and configured to compensate for temperature variation of the base-emitter voltage of the transistor follower to provide a substantially temperature stable instantaneous power output signal.

6. The power detector of claim 5, wherein the network comprises a plurality of transistors and at least two resistors including a first resistor and a second resistor;
wherein a base of the transistor follower is coupled to a node between the first resistor and the second resistor.

7. The power detector of claim 6, wherein the transistors are bipolar transistors.

8. The power detector of claim 6, wherein the transistors are field effect transistors.

9. The power detector of claim 5, wherein the instantaneous power processing device further comprises a capacitor coupled to the transistor follower, the capacitor configured to store a voltage representative of a peak signal level at an output of the transistor follower.

10. A method of power detection comprising:
receiving an input signal at an input of a detector;
detecting with the detector a power level of the input signal to provide a detected signal;
subtracting from the detected signal a signal not related to the input signal to reduce effects of temperature and fabrication process variations at an output of the detector and to provide an output signal;
averaging the output signal and providing an error signal representative of an average power level of the input signal; and
providing an instantaneous power output signal responsive to the output signal, the instantaneous power output signal being representative of the instantaneous power level of the input signal normalized to a representation of the average power level of the input signal.

11. The method of claim 10, further comprising adjusting a scaling factor of the detector based on the error signal.

12. The method of claim 10, wherein providing the instantaneous power output signal includes buffering the output signal using a transistor follower to provide the instantaneous power output signal.

13. The method of claim 12, further comprising compensating for temperature variation of a base-emitter voltage of the transistor follower to provide a substantially temperature stable instantaneous power output signal.

14. The method of claim 10, wherein subtracting from the detected signal the signal not related to the input signal includes subtracting from the detected signal a signal generated by a reference detector which does not receive the input signal.

\* \* \* \* \*

UNITED STATES PATENT AND TRADEMARK OFFICE
CERTIFICATE OF CORRECTION

PATENT NO.       : 8,648,588 B2
APPLICATION NO.  : 13/109808
DATED            : February 11, 2014
INVENTOR(S)      : Yalcin Alper Eken et al.

Page 1 of 1

It is certified that error appears in the above-identified patent and that said Letters Patent is hereby corrected as shown below:

In the Specification:

At column 14, line number 67, delete "unsealed" and insert -- unscaled --.

At column 16, line number 58, delete "unsealed" and insert -- unscaled --.

At column 17, line number 6, delete "Terror" and insert -- Ierror --.

At column 20, line number 28, delete "Iref1" and insert -- Iref2 --.

Signed and Sealed this
Sixth Day of May, 2014

Michelle K. Lee
*Deputy Director of the United States Patent and Trademark Office*